(12) United States Patent
Lee et al.

(10) Patent No.: US 10,957,754 B2
(45) Date of Patent: Mar. 23, 2021

(54) DISPLAY DEVICE

(71) Applicant: Samsung Display Co., Ltd., Yongin-si (KR)

(72) Inventors: June Woo Lee, Yongin-si (KR); Shin Moon Kang, Seoul (KR); Byoung Ki Kim, Seoul (KR); Hee Kyung Kim, Busan (KR); Hyun Chui Son, Asan-si (KR); Yun-Mo Chung, Yongin-si (KR); Jae Beom Choi, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 314 days.

(21) Appl. No.: 15/442,283

(22) Filed: Feb. 24, 2017

(65) Prior Publication Data

US 2017/0263690 A1    Sep. 14, 2017

(30) Foreign Application Priority Data

Mar. 14, 2016 (KR) .................. 10-2016-0030279

(51) Int. Cl.
*H01L 27/32* (2006.01)
*H01L 27/12* (2006.01)
(Continued)

(52) U.S. Cl.
CPC ........ *H01L 27/3262* (2013.01); *G02F 1/1368* (2013.01); *G02F 1/133305* (2013.01);
(Continued)

(58) Field of Classification Search
CPC .................................................. H01L 27/3262
See application file for complete search history.

(56) References Cited

U.S. PATENT DOCUMENTS

2014/0231810 A1* 8/2014 Park .................. H01L 29/41733
                                                                257/66
2014/0300529 A1* 10/2014 Kim ...................... H01L 27/326
                                                                345/80

(Continued)

FOREIGN PATENT DOCUMENTS

| JP | 2005-317575 | 11/2005 |
| KR | 10-2015-0017614 | 2/2015 |
| KR | 10-2015-0037159 | 4/2015 |
| KR | 10-2015-0074808 | 7/2015 |

OTHER PUBLICATIONS

EPO Extended Search Report dated Jul. 20, 2017, for corresponding European Patent Application No. 17160922.5 (8 pages).

*Primary Examiner* — Kenneth Parker
*Assistant Examiner* — Christopher A Culbert
(74) *Attorney, Agent, or Firm* — Lewis Roca Rothgerber Christie LLP

(57) ABSTRACT

A display device includes a display panel including a flexible region and a low flexibility region, wherein the flexible region may include a first transistor including a first semiconductor layer and a first gate electrode, a first conductor connected to the first semiconductor layer, and a first interlayer insulating layer between the first transistor and the first conductor. The low flexibility region may include a second transistor including a second semiconductor layer and a second gate electrode, a second conductor connected to the second semiconductor layer, and a second interlayer insulating layer between the second transistor and the second conductor. The first interlayer insulating layer may include an organic insulating material, the second interlayer insulating layer includes an inorganic insulating material, and a ratio of channel width to channel length of the first transistor may be different from that of the second transistor.

25 Claims, 36 Drawing Sheets

(51) Int. Cl.
   *H01L 51/00*   (2006.01)
   *G02F 1/1333*  (2006.01)
   *G02F 1/1368*  (2006.01)
   *B60K 35/00*   (2006.01)

(52) U.S. Cl.
   CPC ...... *H01L 27/1218* (2013.01); *H01L 27/1248* (2013.01); *H01L 51/0097* (2013.01); *B60K 35/00* (2013.01); *B60K 2370/184* (2019.05); *H01L 27/1251* (2013.01); *H01L 27/3258* (2013.01); *H01L 2227/323* (2013.01); *H01L 2251/5338* (2013.01); *Y02E 10/549* (2013.01)

(56) References Cited

U.S. PATENT DOCUMENTS

| | | | |
|---|---|---|---|
| 2014/0306218 A1 | 10/2014 | Koezuka et al. | |
| 2014/0319474 A1 | 10/2014 | Kim et al. | |
| 2015/0029652 A1* | 1/2015 | Min | G06F 1/1652 |
| | | | 361/679.27 |
| 2015/0062467 A1* | 3/2015 | Kang | G06F 3/0412 |
| | | | 349/12 |
| 2015/0108484 A1 | 4/2015 | Park et al. | |
| 2015/0162392 A1 | 6/2015 | Lim et al. | |
| 2015/0200375 A1* | 7/2015 | Kim | G09F 9/301 |
| | | | 257/40 |
| 2016/0064464 A1 | 3/2016 | Namkung et al. | |

\* cited by examiner

DISPLAY DEVICE

CROSS-REFERENCE TO RELATED APPLICATION

This application claims priority to and the benefit of Korean Patent Application No. 10-2016-0030279 filed in the Korean Intellectual Property Office on Mar. 14, 2016, the entire content of which is incorporated herein by reference.

BACKGROUND

1. Field

One or more aspects of example embodiments of the present disclosure are related to a display device. For example, aspects of embodiments of the present disclosure are related to a display device including a display panel of which a portion can be folded.

2. Description of the Related Art

A display device (such as a liquid crystal display (LCD) and/or an organic light emitting diode (OLED) display) includes a display panel including a plurality of pixels displaying an image. Each pixel includes a pixel electrode that may be supplied with a data signal, and the pixel electrode may be connected to at least one transistor that transmits the data signal.

The transistor includes a control (e.g., gate) electrode, an input (e.g., source) electrode, an output (e.g., drain) electrode, and a semiconductor layer that is connected to the input electrode and the output electrode. The transistor may be connected to a plurality of signal lines to be supplied with a signal. The plurality of signal lines may include a gate line for receiving a gate signal and a data line for receiving a data voltage.

In place of a substrate that is heavy and has a single fixed state (e.g., shape), a display device including a flexible substrate that is lightweight and has a shape that may be changed (e.g., via bending) has been recently developed. The flexible substrate may include a plastic material such as a polyimide.

A display device including a flexible substrate and having a flexible region of which at least a portion is bendable or foldable may be referred to as a flexible display device. A display device in which the portion of the display panel is bendable may be referred to as a bendable display device.

The above information disclosed in this Background section is provided only to enhance understanding of the background of the present disclosure, and may therefore contain information that does not form the prior art that is already known in this country to a person of ordinary skill in the art.

SUMMARY

One or more example embodiments of the present disclosure are directed toward preventing or reducing defects (such as cracks) from being generated in a flexible region of a flexible display device and simultaneously increasing the yield of a manufacturing process of a display device while lowering the curvature radius of a flexible region of a flexible display device. Also, when the flexible display device according to an embodiment of the present disclosure includes a flexible region in addition to a low flexibility region that is less flexible than the flexible region, the flexible display device may have a relatively larger curvature radius and/or may not be substantially deformed, and variations in image luminance near the boundary between the flexible regions and the low flexibility regions may be reduced.

One or more example embodiments of the present disclosure provide a display device including: a display panel including a flexible region and a low flexibility region having lower flexibility than the flexible region, wherein the flexible region includes a first transistor including a first semiconductor layer and a first gate electrode; a first conductor connected to the first semiconductor layer; and a first interlayer insulating layer between the first transistor and the first conductor. The low flexibility region may include a second transistor including a second semiconductor layer and a second gate electrode, a second conductor connected to the second semiconductor layer, and a second interlayer insulating layer positioned between the second transistor and the second conductor. The first interlayer insulating layer may include an organic insulating material, the second interlayer insulating layer may include an inorganic insulating material, and a ratio of a channel width to a channel length of the first transistor may be different from a ratio of a channel width to a channel length of the second transistor.

In some embodiments, the ratio of the channel width to the channel length of the first transistor may be greater or larger than the ratio of the channel width to the channel length of the second transistor.

A side surface of the first interlayer insulating layer may contact a side surface of the second interlayer insulating layer at a boundary between the flexible region and the low flexibility region.

The first interlayer insulating layer may be only between the first gate electrode and the first conductor, and the second interlayer insulating layer may be only between the second gate electrode and the second conductor.

The first transistor may include a first gate insulating layer between the first gate electrode and the first semiconductor layer, and the second transistor may include a second gate insulating layer between the second gate electrode and the second semiconductor layer.

The first gate insulating layer may include the organic insulating material.

The first gate insulating layer may be only between the first gate electrode and the first semiconductor layer, and may not overlap another portion of the first semiconductor layer.

An interface between the first interlayer insulating layer and the second interlayer insulating layer may be inclined or tilted relative to an upper surface of the first interlayer insulating layer or the second interlayer insulating layer at the boundary between the flexible region and the low flexibility region.

An interface between the first interlayer insulating layer and the second interlayer insulating layer may have a stepped shape (e.g., stepped profile) or a protrusion and depression shape (e.g., a surface including one or more protrusions and depressions) along the boundary between the flexible region and the low flexibility region.

The flexible region may further include a first inorganic insulating layer between the first interlayer insulating layer and the first transistor.

The first inorganic insulating layer may include a plurality of island-shaped regions, and each island-shaped region may be positioned only in a region corresponding to the position of the first transistor.

The planar distribution density of the plurality of island-shaped regions included in the first inorganic insulating layer may increase as proximity to the low flexibility region increases.

The low flexibility region may include a plurality of organic island-shaped regions adjacent to the flexible region. The organic island-shaped region may include a third transistor including a third semiconductor layer and a third gate electrode, a third conductor connected to the third semiconductor layer, and a third interlayer insulating layer between the third transistor and the third conductor, and the third interlayer insulating layer may include an organic insulating material.

The planar distribution density of the plurality of organic island-shaped regions may be decreased as proximity to the flexible region decreases.

A boundary between the flexible region and the low flexibility region may form a straight line (as observed in a plan view).

The boundary between the flexible region and the low flexibility region may be winding, may include protrusions and depressions, or may extend in a zigzag line (as observed in a plan view).

The flexible region may include a plurality of inorganic island-shaped regions separated from each other, and the inorganic island-shaped regions may include a first inorganic insulating layer between the first transistor and the first interlayer insulating layer.

The display device may be an organic light emitting diode display including an organic emission layer.

A display device according to an example embodiment of the present disclosure may include a display panel including a flexible region and a low flexibility region having lower flexibility than the flexible region, wherein the flexible region includes a first transistor including a first semiconductor layer and a first gate electrode, a first conductor connected to the first semiconductor layer, and a first interlayer insulating layer between the first transistor and the first conductor. The low flexibility region may include a second transistor including a second semiconductor layer and a second gate electrode, a second conductor connected to the second semiconductor layer, and a second interlayer insulating layer between the second transistor and the second conductor The first interlayer insulating layer may include an organic insulating material and may contact the first gate electrode, and the second interlayer insulating layer may include an inorganic insulating material.

A display device according to an example embodiment of the present disclosure may include a display panel including a flexible region and a low flexibility region having lower flexibility than the flexible region, wherein the flexible region includes a first transistor including a first semiconductor layer and a first gate electrode, a first conductor connected to the first semiconductor layer, and a first interlayer insulating layer between the first transistor and the first conductor. The low flexibility region may include a second transistor including a second semiconductor layer and a second gate electrode, a second conductor connected to the second semiconductor layer, and a second interlayer insulating layer between the second transistor and the second conductor. The first interlayer insulating layer includes an organic insulating material, the second interlayer insulating layer may include an inorganic insulating material, and a side surface of the first interlayer insulating layer and a side surface of the second interlayer insulating layer may contact at a boundary between the flexible region and the low flexibility region.

According to the example embodiments, a defect (such as a crack) may be prevented or reduced in the flexible region even while the curvature radius of the flexible region of the flexible display device is decreased, and the yield may be increased in the manufacturing process of the display device.

Also, in the display device including a flexible region (in which the flexible display device may be bent) and a low flexibility region (that is less flexible than the flexible region), variations in image luminance near the boundary between the flexible region and the low flexibility region may be reduced.

BRIEF DESCRIPTION OF THE DRAWINGS

The accompanying drawings together with the specification illustrate embodiments of the subject matter of the present disclosure, and together with the description serve to explain principles of embodiments of the subject matter of the present disclosure.

DETAILED DESCRIPTION

Figure 1:
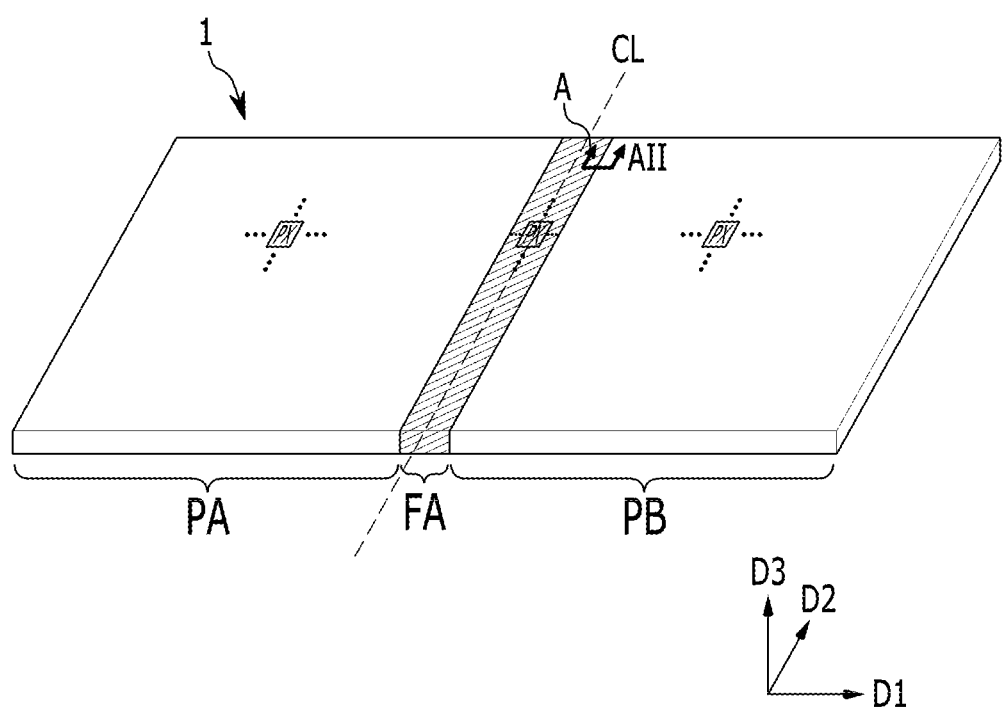
FIG. 1 is a schematic perspective view of a display device according to an example embodiment of the present disclosure.

The present disclosure will be described more fully hereinafter with reference to the accompanying drawings, in which example embodiments of the present disclosure are shown. As those skilled in the art would realize, the described embodiments may be modified in various different ways, all without departing from the spirit or scope of the present disclosure.

The drawings and description are to be regarded as illustrative in nature and are not restrictive. Like reference numerals designate like elements throughout the specification, and duplicative descriptions thereof may not be provided.

In the drawings, the size and thickness of each element may be arbitrarily illustrated for convenience of description, and the present disclosure is not necessarily limited to the sizes and thicknesses illustrated in the drawings. In the drawings, the thickness of layers, films, panels, regions, etc., may be exaggerated for clarity and convenience of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" may refer to positioning on or below the object portion, but does not necessarily refer to positioning on the upper side of the object (based on the direction of gravity).

Unless explicitly described to the contrary, the word "comprise" and variations such as "comprises" or "comprising" will be understood to imply the inclusion of stated elements but not the exclusion of any other elements.

Figure 2:
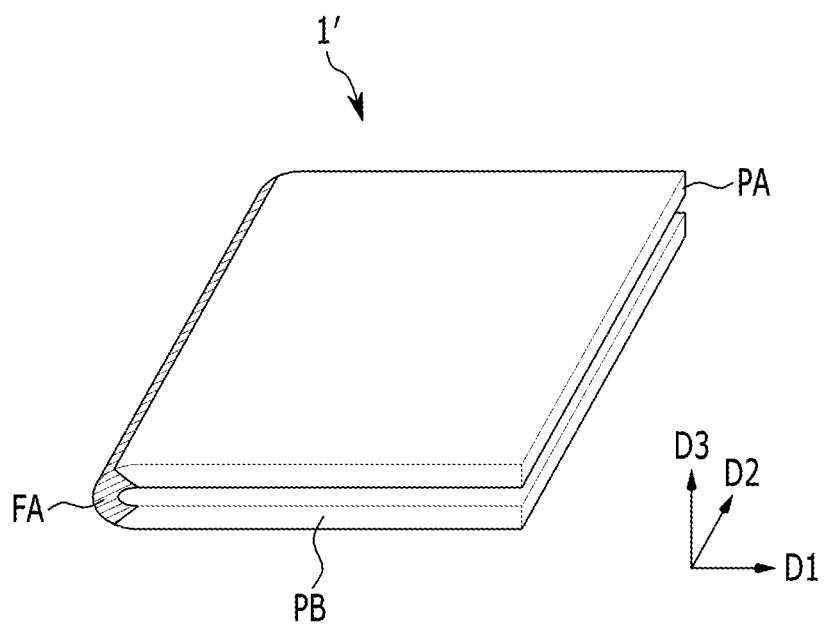
FIG. 2 is a schematic perspective view of the display device shown in FIG. 1, showing a configuration in which a portion of the display device is bent to be folded.

FIG. 1 is a schematic perspective view of a display device according to an example embodiment of the present disclosure, and FIG. 2 is a schematic perspective view showing a configuration in which a portion of the display device shown in FIG. 1 is bent to be folded.

Referring to FIG. 1 and FIG. 2, a display device according to an example embodiment of the present disclosure includes a display panel 1 including a plurality of pixels PX displaying an image. The display panel 1 may be deformed (e.g., folded) such that at least a portion thereof is bent.

When the display panel 1 is in an entirely flat state (e.g., as in FIG. 1), the display panel 1 mainly extends in directions that are substantially parallel to a first direction D1 and a second direction D2 (substantially perpendicular to the first direction D1). An upper surface and a lower surface of the display panel 1 may also mainly extend in directions that are substantially parallel to the first direction D1 and the second direction D2. The display surface of the display panel 1 may be formed on at least one of the upper surface and the lower surface in FIG. 1. In the present disclosure, the term "planar structure" refers to a structure of the display panel 1 as observed in the direction substantially parallel to a third direction D3 (e.g., from the third direction D3), and the term "cross-sectional structure" refers to a structure of a cross-section of the display panel 1 as observed in a direction substantially perpendicular to the third direction D3.

When the display panel 1 is viewed in a flat state from the third direction D3, the display panel 1 may include at least one flexible region FA that is bendable, and at least one low flexibility region PA and/or PB, each having lower flexibility than the flexible region FA.

When the display panel 1 includes a plurality of low flexibility regions PA and PB, one flexible region FA may be between the low flexibility regions PA and PB. FIG. 1 shows an example of the display panel 1 including a pair of low flexibility regions PA and PB on opposite sides of the flexible region FA (e.g. along direction D1).

In some embodiments, the low flexibility regions PA and PB are less flexible than the flexible region FA, and may be bent with a larger curvature radius than the flexible region FA. In some embodiments, the low flexibility regions PA and PB are hardly bent or remain substantially unbent (e.g., are substantially unbendable), and may maintain a flat state.

The flexible region FA may extend from one edge side of the display panel 1 to an opposite edge side, and as shown in FIG. 1, may extend in a straight line, or at least a part thereof may extend in a curved line. FIG. 1 shows an example in which the flexible region FA mainly extends along the second direction D2. However, embodiments of the present disclosure are not limited thereto, and the flexible region FA may extend in a direction that is different from the second direction D2.

When the display panel 1 is bent to be folded in the flexible region FA, a virtual center line CL may be positioned within the flexible region FA. The virtual center line CL may extend along the flexible region FA and may be substantially in the center of the flexible region FA.

The width of the flexible region FA along the first direction D1 may be about 500 μm to 5 mm; however, embodiments of the present disclosure are not limited thereto.

The plurality of pixels PX may be distributed across all of the low flexibility regions PA and PB and the flexible region FA, which thereby all display the image. The plurality of pixels PX may be arranged in a matrix shape or substantially in a rhombus shape on the entire display panel 1; however, embodiments of the present disclosure are not limited thereto. Each pixel PX may display an image of a luminance (e.g., emit light at a luminance level) according to an input image signal input to the display device, and may represent a specific color such as red, green, and/or blue. Here, the luminance gray level of the image displayed by one pixel PX is dependent on the input image signal.

Referring to FIG. 2, the display panel 1 may be substantially bent in the flexible region FA, thereby forming the entirely deformed (e.g., bent) state 1'. In some embodiments, the display panel 1 may be bent in the direction opposite to that shown in FIG. 2 (e.g., such that the surfaces of the low flexibility regions PA and PB visible in the plan view of display panel 1 in FIG. 1 are on substantially opposite outward-facing surfaces after the display panel is bent). When the display panel 1 is able to be bent in either direction, the display surface of the display panel 1 may be formed on both of the upper surface and the lower surface of the display panel 1.

Next, the cross-sectional structure of the display device according to an example embodiment of the present disclosure will be described with reference to FIG. 3 to FIG. 5 as well as FIG. 1 and FIG. 2.

Figure 3:
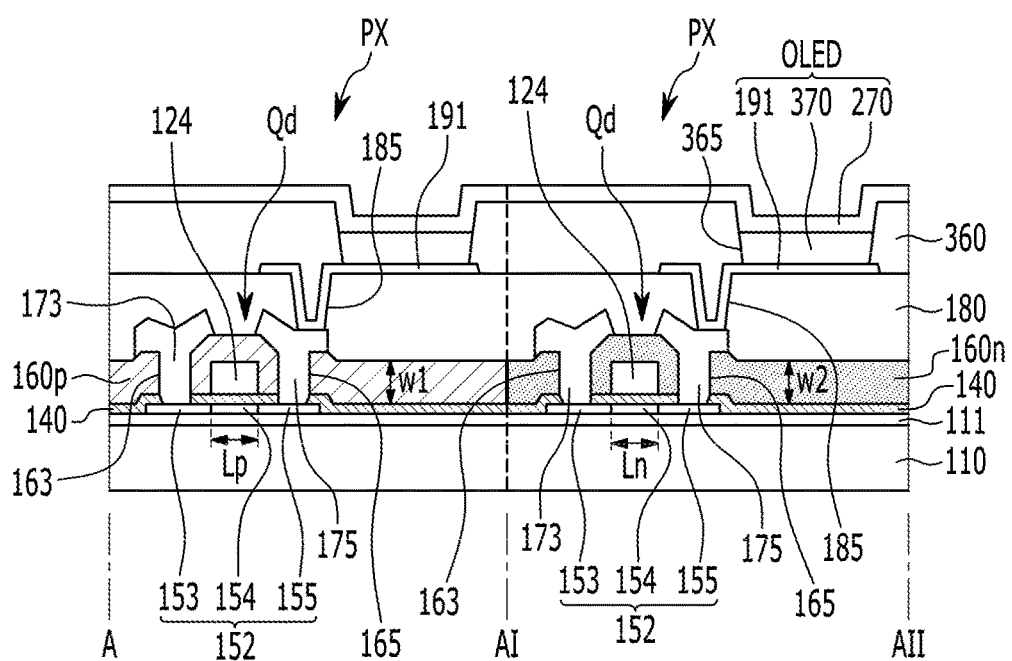
FIG. 3 to FIG. 5 are cross-sectional views of the display device shown in FIG. 1 taken along a line A-AII, respectively.
Figure 4:
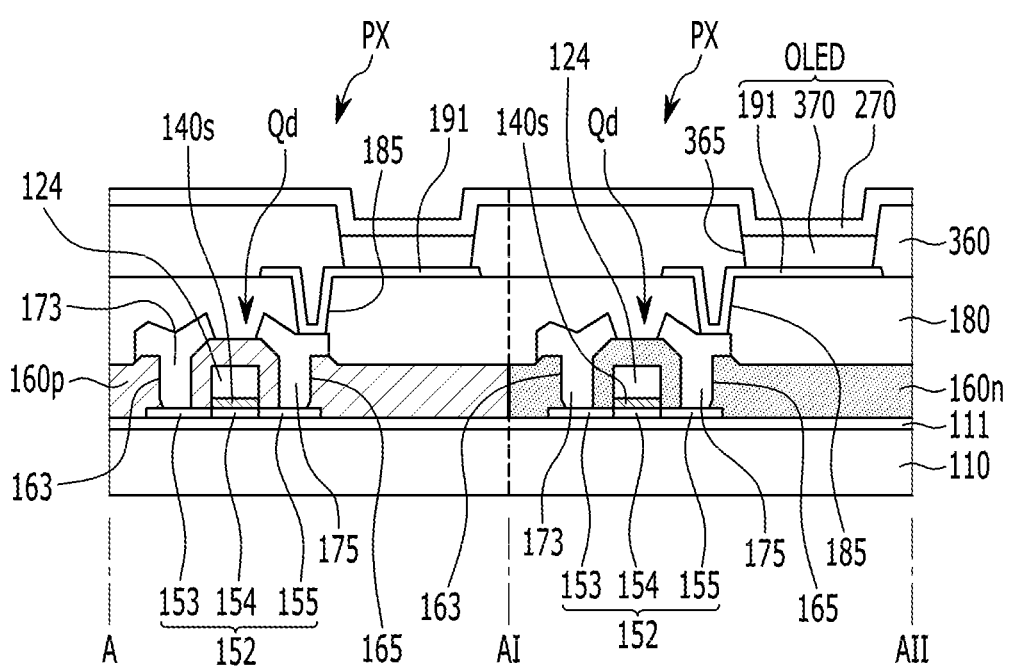
Figure 5:
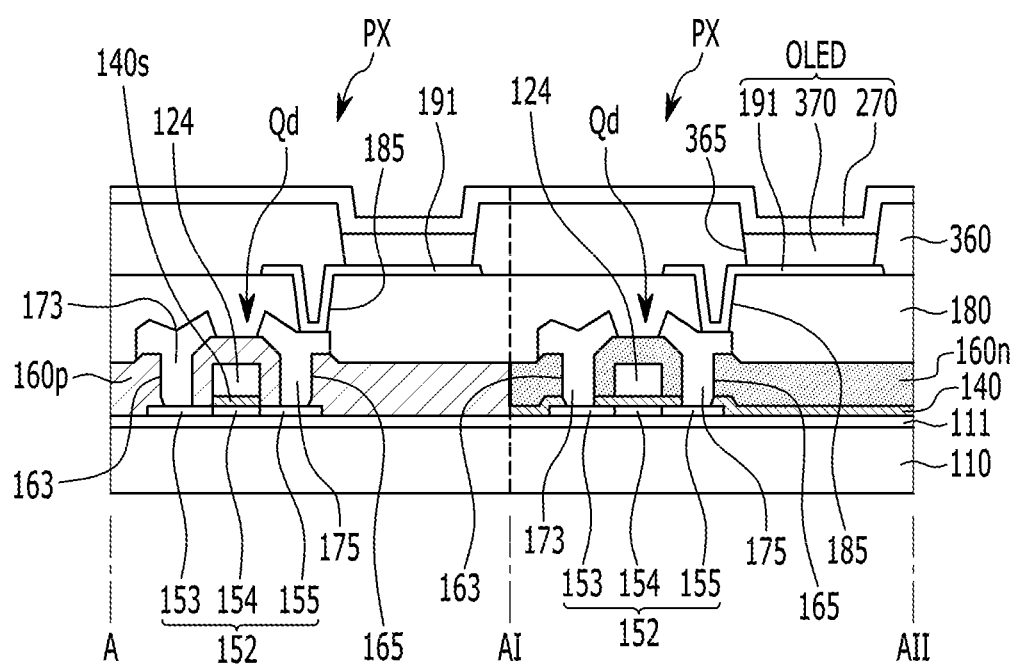

FIG. 3 to FIG. 5 are each a cross-sectional view of an example embodiment of the display device shown in FIG. 1, taken along the line A-AII and showing a cross-sectional structure corresponding to two pixels PX.

A display device according to an example embodiment of the present disclosure includes a substrate 110, a buffer layer 111 on one surface of the substrate 110, and a plurality of transistors Qd on the buffer layer 111.

The substrate 110 may include an inorganic insulating material and/or an organic insulating material (such as a polyimide). The substrate 110 may be a flexible substrate having flexibility or a non-flexible substrate having low flexibility (such as a glass substrate). When the substrate 110 is a non-flexible substrate, contrary to the substrate shown in FIG. 3 to FIG. 5, the substrate 110 may not be included in the flexible region FA.

The buffer layer 111 is between the substrate 110 and the transistor Qd. The buffer layer 111 may prevent or reduce impurities from flowing into the transistor Qd from the substrate 110, thereby preventing or reducing deterioration of the transistor Qd. The buffer layer 111 may include an inorganic insulating material (such as a silicon oxide ($SiO_x$), a silicon nitride ($SiN_x$), aluminum oxide ($Al_2O_3$), hafnium oxide ($HfO_3$), and/or yttrium oxide ($Y_2O_3$)), and/or an organic insulating material. In some embodiments, the portion of the buffer layer 111 in the flexible region FA of the display panel 1 may include the organic insulating material, and the portion of the buffer layer 111 in the low flexibility regions PA and PB may include the inorganic insulating material, but embodiments of the present disclosure are not limited thereto.

The buffer layer 111 may be formed as a single layer or as multiple layers, as shown, and may be formed on the entire area of the substrate 110 or may be formed only under the transistor Qd. The buffer layer 111 may be omitted, depending on the design of the display panel 1.

The transistor Qd may include a semiconductor layer 152, a gate electrode 124, and a gate insulating layer (140 and/or 140s) between the semiconductor layer 152 and the gate electrode 124.

The semiconductor layer 152 may include a channel region 154 in which a channel of the transistor Qd is formed, and a source region 153 and a drain region 155 on either side of the channel region 154. The source region 153 and the drain region 155 may be formed in the same layer as the channel region 154 and may be connected to the channel region 154.

The source region 153, the drain region 155, and the channel region 154 may each be formed of the same material, for example, a metal oxide, a polysilicon, or an amorphous silicon. When the source region 153, the drain region 155, and the channel region 154 each include the metal oxide, non-limiting examples of the metal oxide may include zinc oxide (ZnO), zinc-tin oxide (ZTO), zinc-indium oxide (ZIO), indium oxide (InO), titanium oxide (TiO), indium-gallium-zinc oxide (IGZO), and/or indium-zinc-tin oxide (IZTO).

A carrier concentration in the source region 153 and the drain region 155 may be greater than a carrier concentration in the channel region 154, and the source region 153 and the drain region 155 may be conductive. Gradient regions, in which the carrier concentration gradually changes over space, may be formed between the source region 153 and the channel region 154, and between the drain region 155 and the channel region 154.

The source region 153 and the drain region 155 may be formed by making a portion of the semiconductor material (e.g., the material forming the semiconductor layer 152 on the substrate 110) conductive using a method such as plasma treatment. For example, after the metal oxide semiconductor material is deposited on the substrate 110, the metal oxide semiconductor material may be selectively doped using at least one selected from fluorine gas ($F_2$), hydrogen gas ($H_2$), and sulfur gas ($S_2$) in a chamber to thereby form the source region 153 and the drain region 155. In this case, the portion that is not doped remains as the channel region 154.

The gate electrode 124 may overlap the channel region 154 via (e.g., through) the gate insulating layer (140 and/or 140s). The gate electrode 124 may include a conductive material (such as a metal). FIG. 3 to FIG. 5 show example embodiments in which the gate electrode 124 is on the channel region 154.

The gate insulating layer (140 and/or 140s) may include an inorganic insulating material (such as a silicon oxide ($SiO_x$), a silicon nitride ($SiN_x$), and/or a silicon oxynitride (SiON)) and/or an organic insulating material. In some embodiments, the portion of the gate insulating layer (140 and/or 140s) within the flexible region FA may include the organic insulating material, and the portion of the gate insulating layer (140 and/or 140s) within the low flexibility regions PA and PB may include the inorganic insulating material, but embodiments of the present disclosure are not limited thereto.

The example embodiments shown in FIG. 3 to FIG. 5 differ in the structure of the gate insulating layer (140 and/or 140s).

According to the example embodiment shown in FIG. 3, in all pixels of the flexible region FA and the low flexibility regions PA and PB, the gate insulating layer 140 includes a portion between the gate electrode 124 and the channel region 154, as well as a portion that does not overlap the gate electrode 124. Accordingly, the gate insulating layer 140 may include a portion that contacts the source region 153 and the drain region 155 of the semiconductor layer 152, and a portion that contacts the buffer layer 111.

According to the example embodiment shown in FIG. 4, in all pixels of the flexible region FA and the low flexibility regions PA and PB, the gate insulating layer 140s is mainly between the gate electrode 124 and the channel region 154, thereby forming an island shape. As used herein, the term "island shape" or "island-shaped" indicates that the region is formed of different materials from the surrounding area, and is smaller in area than a larger region formed of the same materials. The planar shape of the gate insulating layer 140s may be substantially the same (e.g., have approximately or about the same footprint) as the planar shape of the gate electrode 124. In other words, the edge sides of the gate insulating layer 140s may be substantially parallel with and may be approximately or substantially aligned to corresponding edge sides of the gate electrode 124. This may be attained by forming the gate electrode 124 and the gate insulating layer 140s using the same photomask in the manufacturing process of the display panel 1. The gate insulating layer 140s may cover most of the channel region 154 of the semiconductor layer 152.

According to the example embodiment shown in FIG. 5, the gate insulating layer 140s of each pixel in the flexible region FA may have a different structure from the gate insulating layer 140 of each pixel in the low flexibility regions PA and PB. The gate insulating layer 140s of each pixel in the flexible region FA may have substantially the same island shape as the gate insulating layer 140s according to the example embodiment shown in FIG. 4, and the gate insulating layer 140 of each pixel in the low flexibility regions PA and PB may be substantially the same as the gate insulating layer 140 according to the example embodiment shown in FIG. 3.

In some embodiments, when the gate insulating layer 140 and 140s include the inorganic insulating material, as shown in FIG. 5, the gate insulating layer 140s of each pixel within the flexible region FA may be formed as an island shape so that the gate insulating layer 140s is only positioned between the gate electrode 124 and the channel region 154. Accordingly, because the area of the gate insulating layer 140s of each pixel within the flexible region FA is limited, when the display panel 1 is bent in the flexible region FA, defects (such as cracks in the gate insulating layer 140s) may be prevented or reduced.

The planar shape of the channel region 154 in the semiconductor layer 152 may be substantially the same (e.g., have approximately or substantially the same footprint) as the planar shape of the gate electrode 124. In other words, each edge side of the channel region 154 may be substantially parallel to and may be approximately or substantially aligned with each corresponding edge side of the gate electrode 124. For example, the boundary between the channel region 154 and the source region 153 and the boundary between the channel region 154 and the drain region 155 may each be substantially parallel to or aligned with opposite edges of the gate electrode 124.

The channel lengths Lp and Ln of the channel region 154 of the transistors Qd (e.g., in the flexible area FA and low flexibility area PB depicted in FIG. 3) may be about 3 μm to 200 μm, and the channel width of each may be about 3 μm to 200 μm, but embodiments of the present disclosure are not limited thereto.

Interlayer insulating layers 160n and 160p may be on the transistors Qd. The interlayer insulating layers 160n and 160p may include an interlayer insulating layer 160p in the flexible region FA and an interlayer insulating layer 160n in the low flexibility regions PA and PB. The interlayer insulating layer 160p and the interlayer insulating layer 160n may be formed of different materials and/or have different structures.

The interlayer insulating layer 160p in the flexible region FA may include the organic insulating material and may not include the inorganic insulating material. Accordingly, when the display panel 1 is bent in the flexible region FA, even if the curvature radius is very small, generation of defects (such as cracks) may be prevented or reduced in the interlayer insulating layer 160p. In this case, the interlayer insulating layer 160p may directly contact the gate electrode 124 of the transistor Qd.

In contrast, the interlayer insulating layer 160n of each pixel in the low flexibility regions PA and PB may include the inorganic insulating material, and may not include the organic insulating material. Since the low flexibility regions PA and PB are not regions that are substantially bent (e.g., are not regions involved in bending), there is a lower probability that a defect (such as cracks) will be generated in this region even when the interlayer insulating layer 160n is made of the inorganic insulating material.

When the interlayer insulating layers 160n and 160p of the entire display panel 1 are formed of the organic insulating material, the yield of the manufacturing process of the display panel 1 may be lower than when the interlayer insulating layers 160n and 160p are formed of the inorganic insulating material. As the area occupied by the interlayer insulating layers 160n and 160p including the organic insulating material is increased (e.g., as the proportion of organic insulating material used in the interlayer insulating layers 160n and 160p is increased), the yield of the manufacturing process is decreased. However, as in the present example embodiment, when only the interlayer insulating layer 160p of the flexible region FA that is frequently bent includes the organic insulating material, the area of the interlayer insulating layer 160n and 160p including the organic insulating material may be minimized or reduced, such that the yield of the manufacturing process of the display panel 1 may be maximized or increased while reducing the rate or possibility of defect generation in the flexible region FA.

Non-limiting examples of the inorganic insulating material included in the interlayer insulating layer 160n of each pixel in the low flexibility regions PA and PB may include silicon oxide ($SiO_x$), silicon nitride ($SiN_x$), silicon oxynitride (SiON), and/or silicon oxyfluoride (SiOF).

As described above, when the materials of the interlayer insulating layers 160n and 160p in the flexible region FA and the low flexibility regions PA and PB are different from each other, if the dimensions of each transistor Qd are substantially constant (e.g. the same), the characteristics of the semiconductor layer 152 of the transistor Qd in the flexible region FA (such as mobility, on/off ratio, and leakage current upon turning-off) may be different from the characteristics of the semiconductor layer 152 of the transistor Qd in the low flexibility regions PA and PB. However, the dimensions of the channel region 154 of both transistors Qd (such as the size and/or the shape) may be suitably controlled or selected so that the characteristics of the transistor Qd in the flexible region FA and the characteristics of the transistor Qd in the low flexibility regions PA and PB are substantially identical to each other. For example, to have the substantially identical performance characteristics, the ratio of the channel width to the channel length Lp of the channel region 154 of the transistor Qd in the flexible region FA and the ratio of the channel width to the channel length Ln of the channel region 154 of the transistor Qd in the low flexibility regions PA and PB may be controlled or selected to be different from each other.

In the case of the transistor Qd in the flexible region FA, in which the interlayer insulating layer 160p includes the organic material, the amount of the impurity doped into the semiconductor layer 152 may be lower than in the case of the transistor Qd in the low flexibility regions PA and PB. In some embodiments, the characteristics of the transistor Qd in the flexible region FA (such as the mobility, on/off ratio, and leakage current upon turning off) may be degraded during annealing compared with those of the transistor Qd of the low flexibility regions PA and PB. Accordingly, in order for the characteristics of the transistor Qd in the flexible region FA and the characteristics of the transistor Qd in the low flexibility regions PA and PB to be the same, the ratio of the channel width to the channel length Lp of the channel region 154 of the transistor Qd in the flexible region FA may be designed (e.g., suitably chosen) to be greater than the ratio of the channel width to the channel length Lp of the channel region 154 of the transistor Qd in the low flexibility regions PA and PB.

Accordingly, when the characteristics of the transistor Qd in the flexible region FA and the characteristics of the transistor Qd in the low flexibility regions PA and PB are substantially equal to each other, differences in the luminance of the image near the boundary between the flexible region FA and the low flexibility regions PA and PB due to differences in the characteristics of the corresponding transistors Qd may be minimized or reduced, thereby increasing the display quality.

A cross-sectional thickness w1 of the interlayer insulating layer 160p in the flexible region FA may be equal to or different from the cross-sectional thickness w2 of the interlayer insulating layer 160n in the low flexibility regions PA and PB. To control the characteristics of the transistor Qd in the flexible region FA and the characteristics of the transistor Qd in the low flexibility regions PA and PB, the cross-sectional thickness w1 of the interlayer insulating layer 160p in the flexible region FA and the cross-sectional thickness w2 of the interlayer insulating layer 160n in the low flexibility regions PA and PB may be controlled or selected to be different from each other.

To overcome characteristic differences of the transistors Qd between the flexible region FA and the low flexibility regions PA and PB, the dimensions of the transistor Qd may be controlled as described above. However, in the case that it is difficult to overcome the characteristic differences of the transistors Qd between the flexible region FA and the low flexibility regions PA and PB through this method or other methods, the differences in luminance may be minimized or reduced by using feedback from the luminance of the images displayed in the flexible region FA and the low flexibility regions PA and PB to control (e.g., modulate) the values of the data signals applied to the pixels PX. A compensation value for each data signal depending on the luminance differences between the flexible region FA and the low flexibility regions PA and PB may be separately stored in memory.

The side surface of the interlayer insulating layer 160p and the side surface of the interlayer insulating layer 160n may contact each other at the boundary between the flexible region FA and the low flexibility regions PA and PB, thereby forming an interface.

The interface between the interlayer insulating layer 160n and the interlayer insulating layer 160p, as shown in FIG. 3 to FIG. 5 (e.g., along the dotted line above AI), may be substantially parallel to the third direction D3 and substantially perpendicular to the first direction D1. From a cross-sectional perspective, the interface between the interlayer insulating layer 160n and the interlayer insulating layer 160p may be substantially perpendicular to the surface of the substrate 110, but embodiments of the present disclosure are not limited thereto.

The interlayer insulating layers 160n and 160p may each independently be formed as single layers or multiple layers.

The interlayer insulating layers 160n and 160p and the gate insulating layer 140 may include a contact hole 163 on the source region 153 of the semiconductor layer 152 and overlapping the source region 153, and a contact hole 165 on the drain region 155 and overlapping the drain region 155.

A data conductor including a source electrode 173 and a drain electrode 175 may be on the interlayer insulating layers 160n and 160p. The source electrode 173 may be electrically connected to the source region 153 of the transistor Qd through the contact hole 163, and the drain electrode 175 may be electrically connected to the drain region 155 of the transistor Qd though the contact hole 165.

A passivation layer 180 may be on the interlayer insulating layers 160n and 160p and the data conductor. The passivation layer 180 may include at least one of the inorganic insulating material and the organic insulating material, and may be formed as a single layer or as multiple layers. The upper surface of the passivation layer 180 may be substantially flat.

The passivation layer 180 may include a contact hole 185 on the drain electrode 175 and overlapping the drain electrode 175.

A pixel electrode 191 may be on the passivation layer 180. The pixel electrode 191 may be electrically connected to the drain electrode 175 through the contact hole 185 of the passivation layer 180, thereby receiving the data voltage from the transistor Qd.

The display device according to the present example embodiment may have one or more suitable structures. For example, in an organic light emitting device, a pixel definition layer 360 may be on the pixel electrode 191 and the passivation layer 180. The pixel definition layer 360 may include an opening 365 on the pixel electrode 191. In the opening 365 of the pixel definition layer 360, an emission layer 370 may be on the pixel electrode 191, and the common electrode 270 may be on the emission layer 370. A common voltage may be applied to the common electrode 270. The pixel electrode 191, the emission layer 370, and the common electrode 270 may collectively form an organic light emitting diode (OLED). The pixel electrode 191 may be an anode of the organic light emitting diode (OLED), and the common electrode 270 may be a cathode of the organic light emitting diode (OLED), or vice versa.

The light emitted from the emission layer 370 may pass through the substrate 110 to be emitted through the lower side of the substrate 110, or may be emitted in the upper side of the device (e.g., not through the substrate 110).

The structure of the layers on the pixel electrode 191 is not limited to these example embodiments, and may be suitably changed according to the type or kind of display device.

A method for manufacturing the display panel 1 having the interlayer insulating layer 160n and the interlayer insulating layer 160p including the different materials will be described with reference to FIG. 3 to FIG. 5.

After forming the buffer layer 111, the semiconductor layer 152, the gate insulating layer (140 and 140s), and the gate electrode 124 are formed on the substrate 110 or a separate substrate, the inorganic insulating material may be deposited on the entire surface of the substrate 110 to form the inorganic insulating material layer.

Next, the inorganic insulating material layer in the flexible region FA may be removed using a patterning method (such as a photolithography process) to thereby form the interlayer insulating layer 160n in the low flexibility regions PA and PB. In this case, by patterning the inorganic insulating material layer, the contact holes 163 and 165 in the low flexibility regions PA and PB may be formed together (e.g., simultaneously) in the interlayer insulating layer 160n and the gate insulating layer 140.

Next, the organic insulating material layer may be deposited on the entire surface of the substrate 110, and the upper part of the organic insulating material layer may be removed using surface exposure, surface etching and/or chemical mechanical polishing (CMP) on the entire surface to remove most of the organic insulating material layer in the low flexibility regions PA and PB, thereby leaving the interlayer insulating layer 160p only in the flexible region FA.

Next, the contact holes 163 and 165 may be formed in the interlayer insulating layer 160p and the gate insulating layer 140 by patterning the interlayer insulating layer 160p in the flexible region FA. In some embodiments when the contact holes 163 and 165 of the interlayer insulating layer 160n and the gate insulating layer 140 in the low flexibility regions PA and PB are not formed in the previous process, the contact holes 163 and 165 of the interlayer insulating layer 160n and the gate insulating layer 140 in the low flexibility regions PA and PB may be formed during, after, or before forming the contact holes 163 and 165 of the interlayer insulating layer 160p and the gate insulating layer 140 in the flexible region FA.

Next, a conductive material may be deposited and patterned on the interlayer insulating layers 160n and 160p to form the source electrode 173 and the drain electrode 175, and the passivation layer 180 may be deposited and patterned to form the contact hole 185.

Next, the pixel electrode 191 may be formed on the passivation layer 180.

A detailed structure of the display device according to an example embodiment of the present disclosure will be described with reference to FIG. 6 to FIG. 8 as well as FIG. 1 to FIG. 5.

Figure 6:
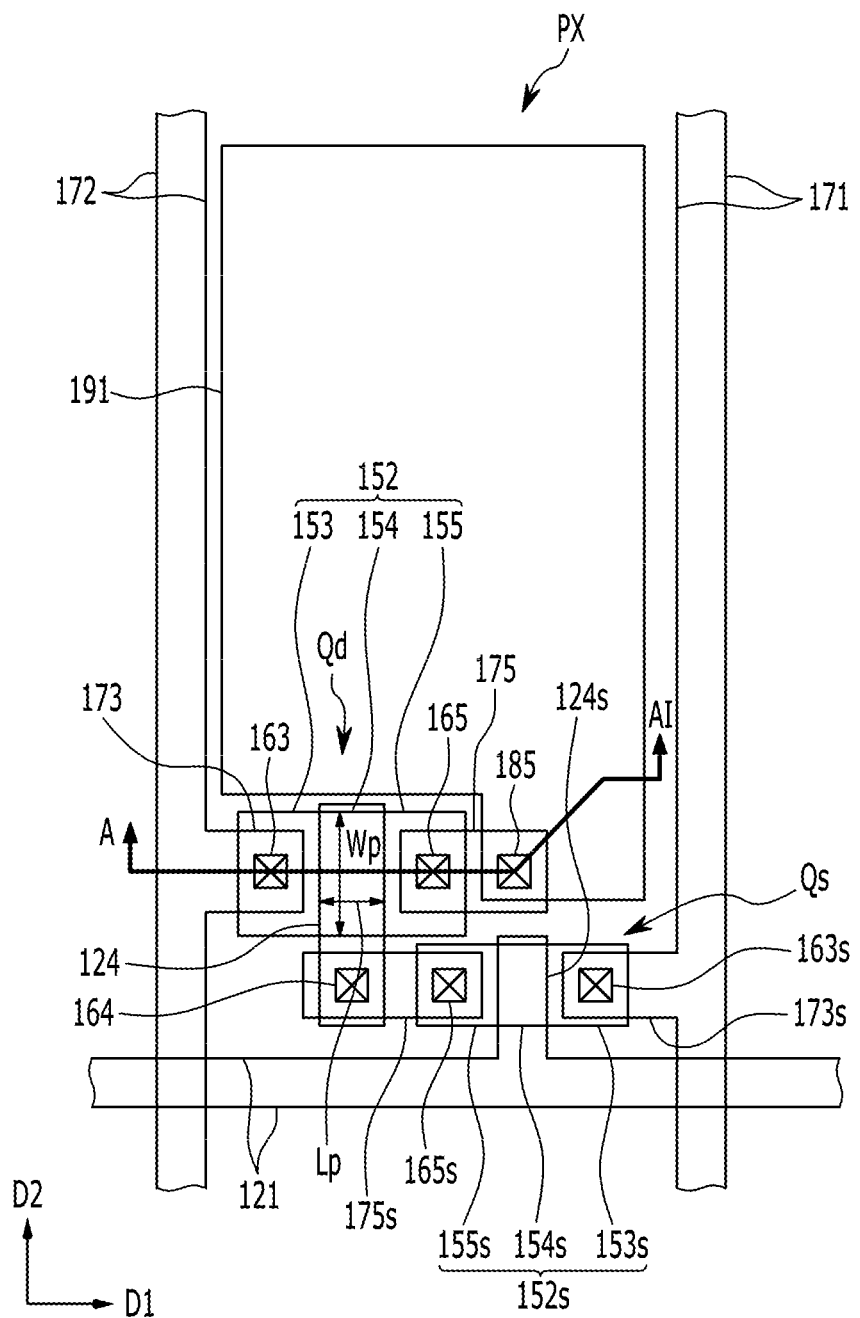
FIG. 6 is a layout view of one pixel positioned in a flexible region of a display device according to an example embodiment of the present disclosure.

FIG. 6 is a layout view of one pixel from a flexible region of a display device according to an example embodiment of the present disclosure. FIG. 7 is a layout view of one pixel from a low flexibility region of a display device according to an example embodiment of the present disclosure. FIG. 8 is an equivalent circuit diagram of one pixel of a display device according to an example embodiment of the present disclosure.

Each cross-sectional view shown in FIG. 3 to FIG. 5 corresponds to the cross-sectional view taken along the line A-AI shown in FIG. 6 and the line AI-AII shown in FIG. 7, which will be described in more detail hereafter. The line A-AI-AII corresponds to the line A-AII shown in FIG. 1.

Figure 7:
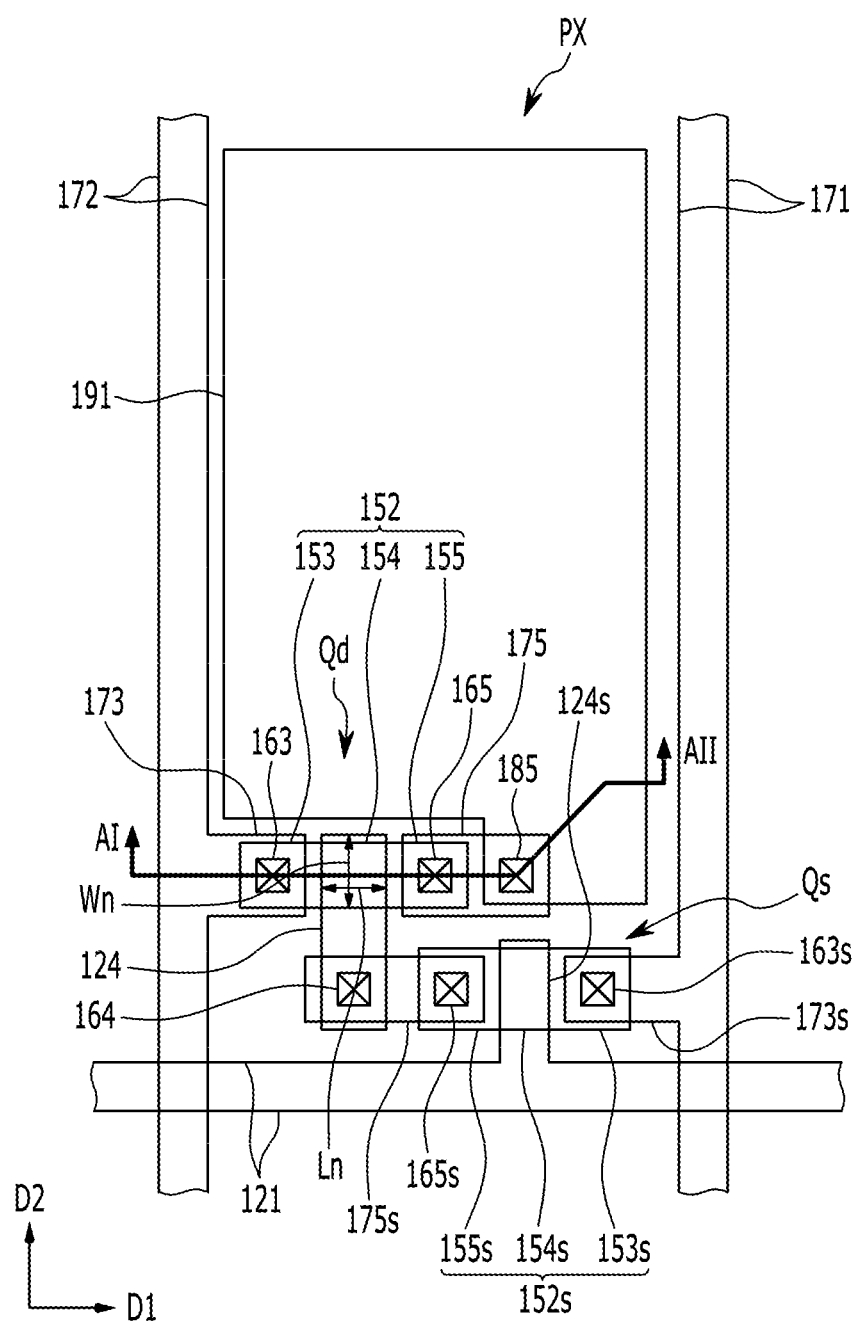
FIG. 7 is a layout view of one pixel positioned in a low flexibility region of a display device according to an example embodiment of the present disclosure.

Referring to FIG. 6 and FIG. 7 along with FIG. 3 to FIG. 5, signal lines (such as a gate line 121 transmitting a gate signal, a data line 171 transmitting a data signal, and/or a driving voltage line 172 transmitting a driving voltage), and a switching transistor Qs including a switching semiconductor layer 152s, a switching gate electrode 124s, a switching source electrode 173s, and a switching drain electrode 175s may be further positioned on the substrate 110.

The gate line 121 may include a portion extending substantially in the first direction D1, and the data line 171 and the driving voltage line 172 may include a portion extending substantially in the second direction D2.

The switching semiconductor layer 152s may include a channel region 154s in which the channel of the switching transistor Qs is formed, and a switching source region 153s and a switching drain region 155s on either side of the channel region 154s. The switching semiconductor layer 152s may include, for example, a metal oxide, a polysilicon, and/or an amorphous silicon, and may be in the same layer as the semiconductor layer 152 of the transistor Qd, but embodiments of the present disclosure are not limited thereto.

The carrier concentration in the switching source region 153s and the switching drain region 155s may be greater than the carrier concentration in the switching channel region 154s. The switching source region 153s and the switching drain region 155s may be conductive.

The switching gate electrode 124s may overlap the channel region 154s of the switching semiconductor layer 152s through the gate insulating layer (140 and 140s). The switching gate electrode 124s may be in the same layer as the gate electrode 124 of the transistor Qd. The switching gate electrode 124s may be connected with the gate line 121, thereby receiving the gate signal. The gate line 121 may be in the same layer as the switching gate electrode 124s, but embodiments of the present disclosure are not limited thereto.

The interlayer insulating layers 160n and 160p may further include a contact hole 163s on the switching source region 153s of the switching semiconductor layer 152s, and a contact hole 165s on the switching drain region 155s.

The switching source electrode 173s and the switching drain electrode 175s may be in the same layer as the data conductor that is described above. The switching source electrode 173s may be electrically connected to the switching source region 153s of the switching transistor Qs through the contact hole 163s, and the switching drain electrode 175s may be electrically connected to the switching drain region 155s of the switching transistor Qs through the contact hole 165s.

The switching source electrode 173s may be connected with the data line 171, thereby receiving the data signal to be transmitted to the switching transistor Qs. The data line 171 may be in the same layer as the switching source electrode 173s, but embodiments of the present disclosure are not limited thereto.

The interlayer insulating layer (160n and 160p) may further include a contact hole 164 on the gate electrode 124 of the transistor Qd described above. The switching drain electrode 175s may be electrically connected to the gate electrode 124 through the contact hole 164. Accordingly, the voltage transmitted from the switching drain region 155s of the switching transistor Qs may be applied to the gate electrode 124 of the transistor Qd.

The source electrode 173 of the transistor Qd may be connected with the driving voltage line 172, and may thereby receive the driving voltage. The driving voltage line 172 may be in the same layer as the source electrode 173, but embodiments of the present disclosure are not limited thereto.

As described above, the ratio of the channel width Wp/the channel length Lp of the channel region 154 of the transistor Qd of FIG. 6 in the flexible region FA and the ratio of the channel width Wn/the channel length Ln of the channel region 154 of the transistor Qd of FIG. 7 in the low flexibility regions PA and PB may be controlled or selected to be different from each other. Referring to FIG. 6 and FIG. 7, the value (e.g., ratio) of the channel width Wp/the channel length Lp of the transistor Qd in the flexible region FA may be greater than the value (e.g., ratio) of the channel width Wn/the channel length Ln of the transistor Qd in the low flexibility regions PA and PB. If the channel lengths Ln and Lp are constant (e.g., the same), as shown in FIG. 6 and FIG. 7, the channel width Wp of the channel region 154 of the transistor Qd in the flexible region FA may be greater than the channel width Wn of the channel region 154 of the transistor Qd in the low flexibility regions PA and PB.

Figure 8:
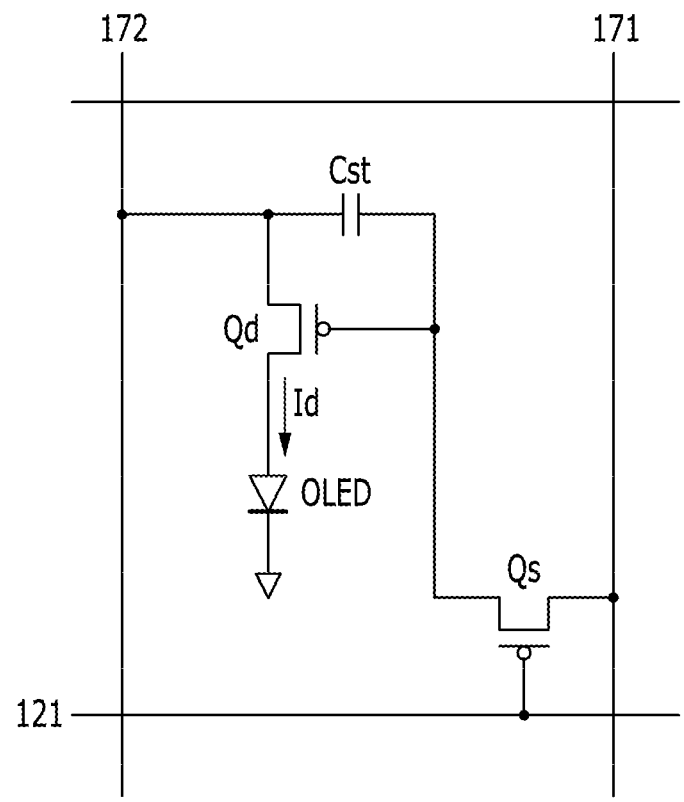
FIG. 8 is an equivalent circuit diagram of one pixel of a display device according to an example embodiment of the present disclosure.

An equivalent circuit of one pixel PX of the display device according to the example embodiment shown in FIG. 6 and FIG. 7 is as shown in FIG. 8. Referring to FIG. 8, one pixel PX may include a switching transistor Qs, a transistor Qd, a capacitor Cst, and an organic light emitting diode OLED.

The switching transistor Qs may include a control terminal connected to the gate line 121, an input terminal connected to the data line 171, and an output terminal connected to the control terminal of the transistor Qd. The switching transistor Qs transmits the data signal transmitted from the data line 171 to the control terminal of the transistor Qd in response to the gate signal transmitted by the gate line 121.

The transistor Qd may include an input terminal connected to the driving voltage line 172 and an output terminal connected to the organic light emitting diode OLED. The transistor Qd may be a driving transistor that amplifies and/or outputs an output current Id with a magnitude based on the voltage difference between the control terminal and the output terminal.

The capacitor Cst may be connected between the control terminal and the input terminal of the transistor Qd. The capacitor Cst may be charged by the data signal applied to the control terminal of the transistor Qd, and may maintain the data signal even after the switching transistor Qs is turned off.

The organic light emitting diode (OLED) displays an image by emitting light with varying intensity according to the output current Id.

The switching transistor Qs and the transistor Qd may each independently be a p-type transistor (such as a PMOS) or an n-type transistor (such as a NMOS), as shown. The channel type of the switching transistor Qs and the transistor Qd may be the same as or different from each other. The connectivity of the transistors Qs and Qd, the capacitor Cst, and the organic light emitting diode OLED may be changed depending on the channel type of the switching transistor Qs and the transistor Qd (e.g., p-channel or n-channel).

Next, one or more cross-sectional structures of the display device according to an example embodiment of the present disclosure will be described with reference to FIG. 9 to FIG. 17 along with the above-described drawings.

FIG. 9 to FIG. 17 are each a cross-sectional view of an example embodiment of the display device FIG. 1 taken along the line A-AII.

Figure 9:
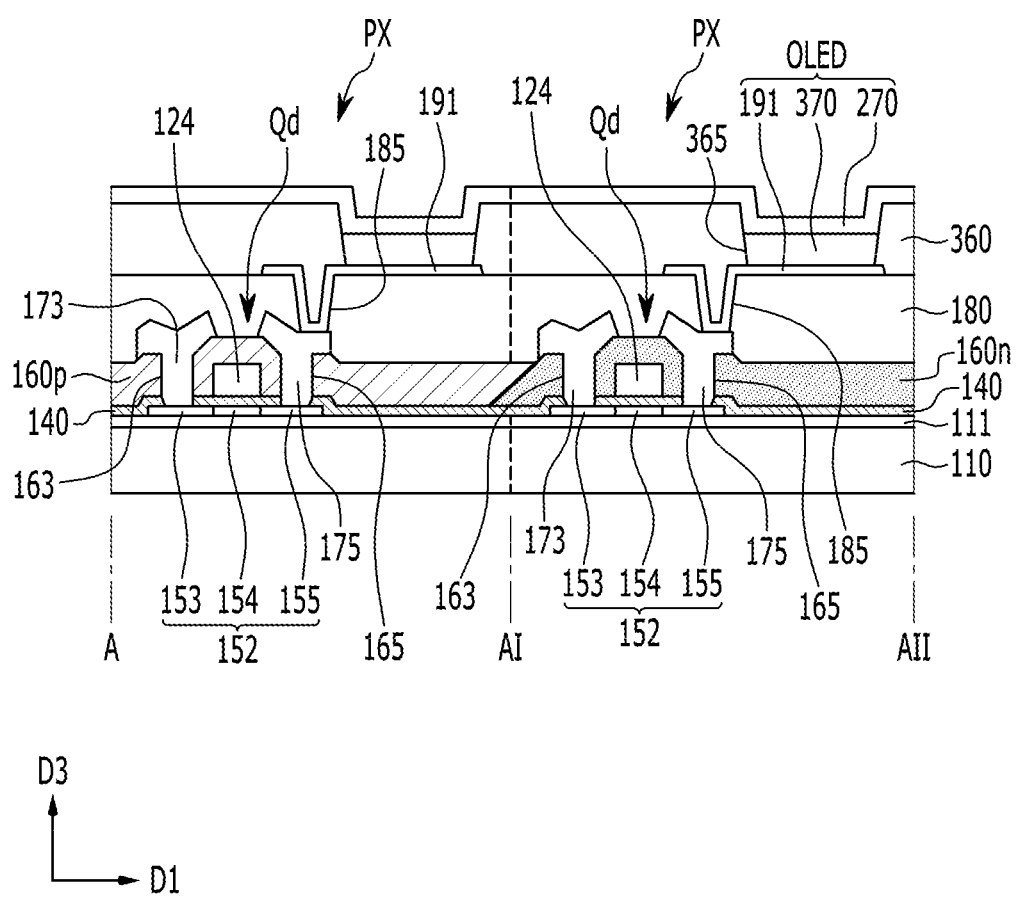
FIG. 9 to FIG. 17 are cross-sectional views of the display device shown in FIG. 1 taken along the line A-AII, according to example embodiments of the present disclosure.
Figure 10:
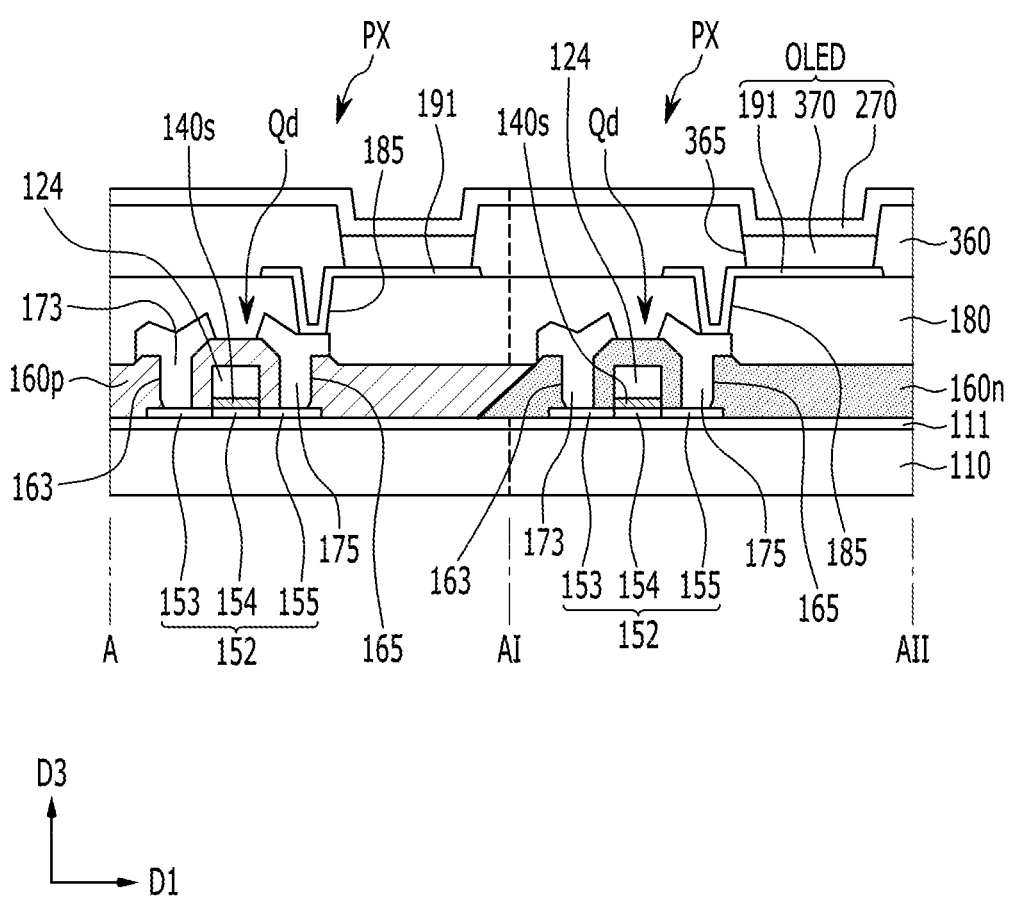
Figure 11:
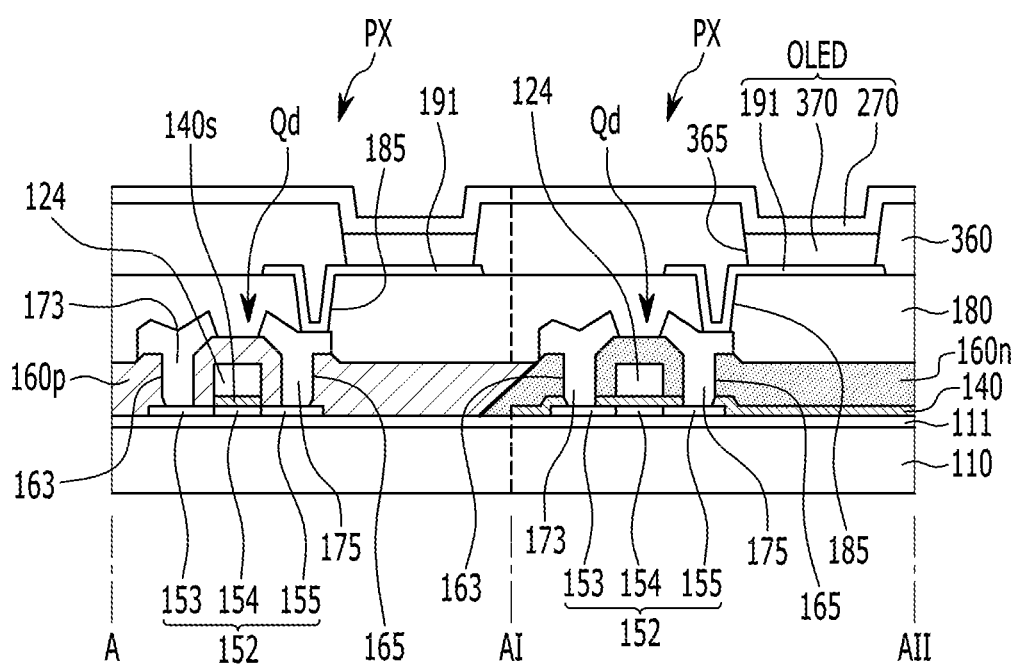
Figure 11:
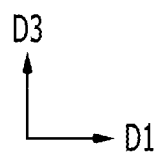

The display devices of examples to FIG. 9 to FIG. 11 are mostly similar to the example embodiments shown in FIG. 3 to FIG. 5; however, the interface between the interlayer insulating layer 160n and the interlayer insulating layer 160p at the boundary between the flexible region FA and the low flexibility regions PA and PB may not be substantially parallel to the third direction D3 and may also not be substantially perpendicular to the first direction D1. From a cross-sectional perspective, the interface between the interlayer insulating layer 160n and the interlayer insulating layer 160p may be obliquely inclined or tilted with respect to the surface of the substrate 110 and/or the upper surface of the interlayer insulating layers 160n and 160p. Accordingly, the surface area of the interface between the interlayer insulating layer 160n and the interlayer insulating layer 160p may be increased, such that even if the flexible region FA of the display panel 1 is repeatedly deformed, separation of the interlayer insulating layer 160n and the interlayer insulating layer 160p at the interface may be reduced.

Figure 12:
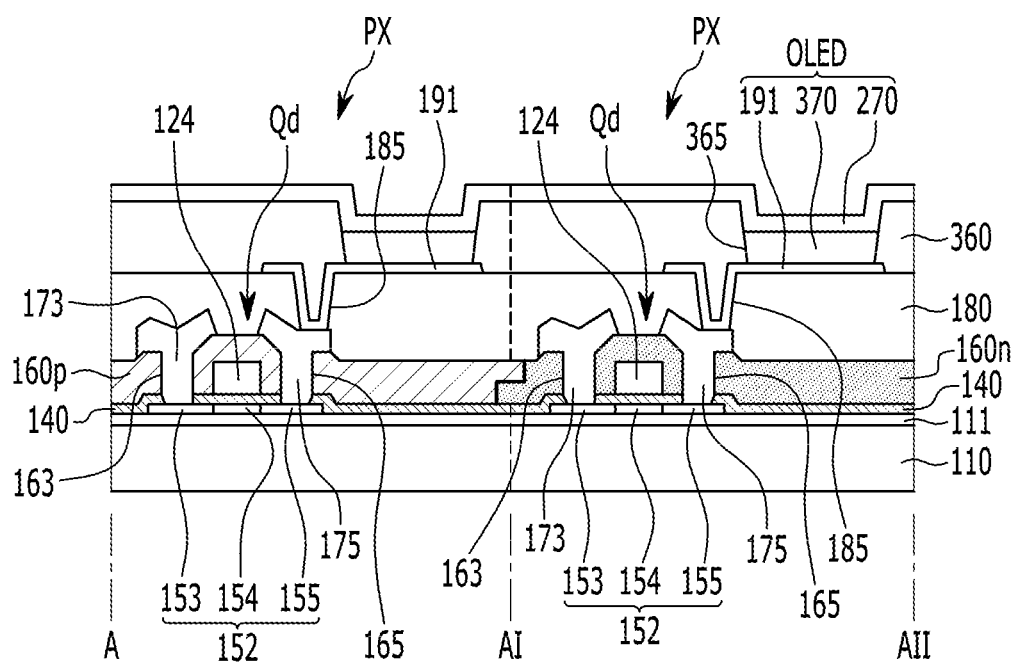
Figure 13:
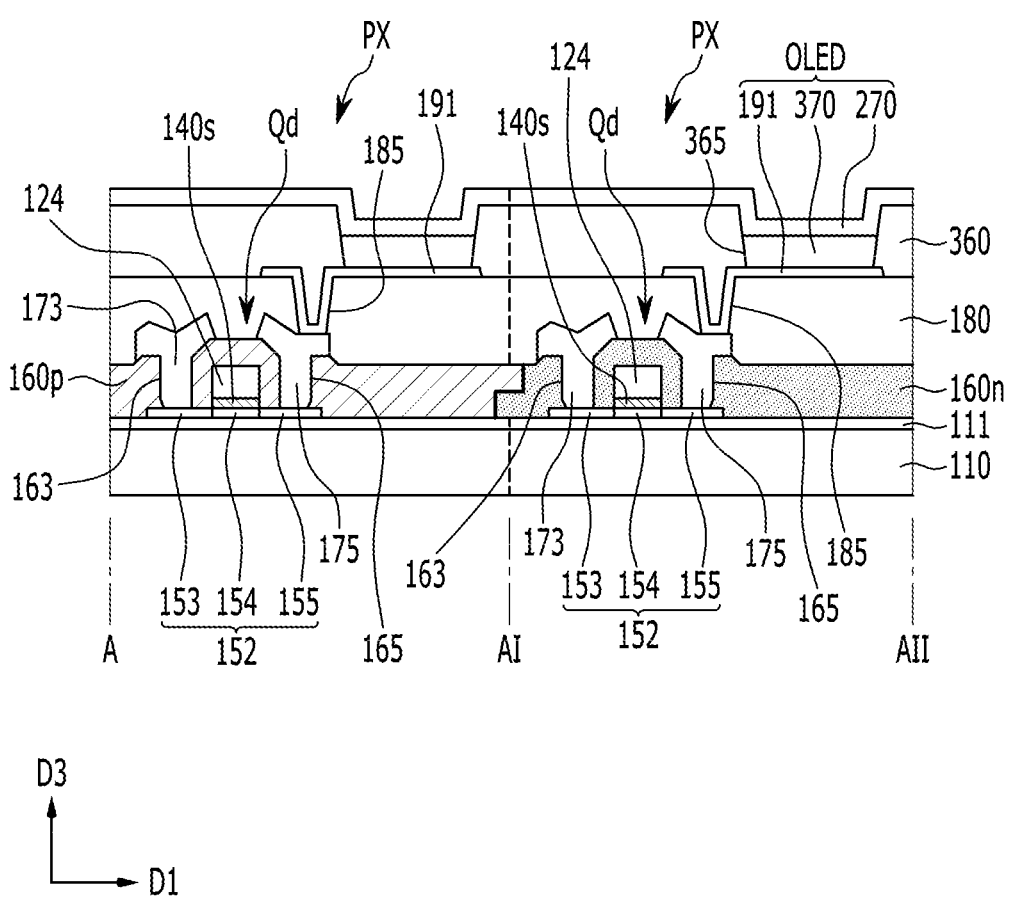
Figure 14:
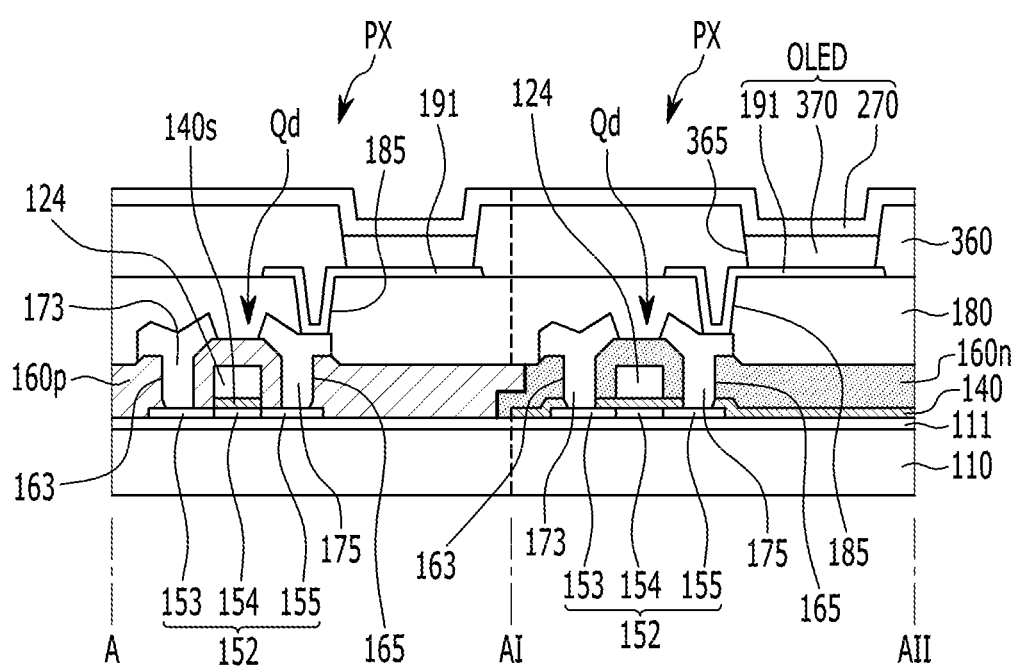

The display devices of FIG. 12 to FIG. 14 are mostly similar to the above-described example embodiments shown in FIG. 9 to FIG. 11, except that the interface between the interlayer insulating layer 160n and the interlayer insulating layer 160p is not flat (e.g. without internal angles), but is bent in at least one part, thereby forming a stepped surface or shape. For example, as shown in FIG. 12 to FIG. 14, the interface between the interlayer insulating layer 160n and the interlayer insulating layer 160p may include at least one portion that is substantially perpendicular to the third direction D3, and a plurality of portions connected thereto that are approximately or substantially parallel to the third direction D3.

In some embodiments, the interface between the interlayer insulating layer 160n and the interlayer insulating layer 160p may include one or more protrusions, depressions, and/or other shapes.

Accordingly, the area of the interface between the interlayer insulating layer 160n and the interlayer insulating layer 160p may be increased, and even if the flexible region FA of the display panel 1 is repeatedly deformed, the separation of the interlayer insulating layer 160n and the interlayer insulating layer 160p at the interface may be reduced.

Figure 15:
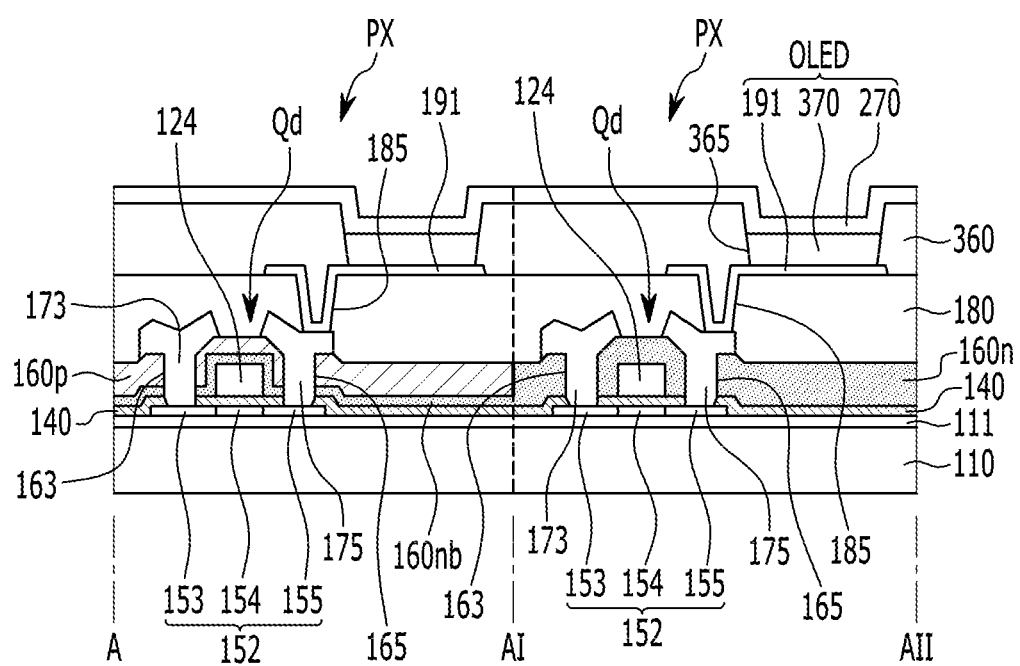
Figure 15:
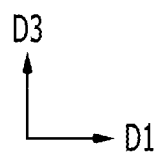
Figure 16:
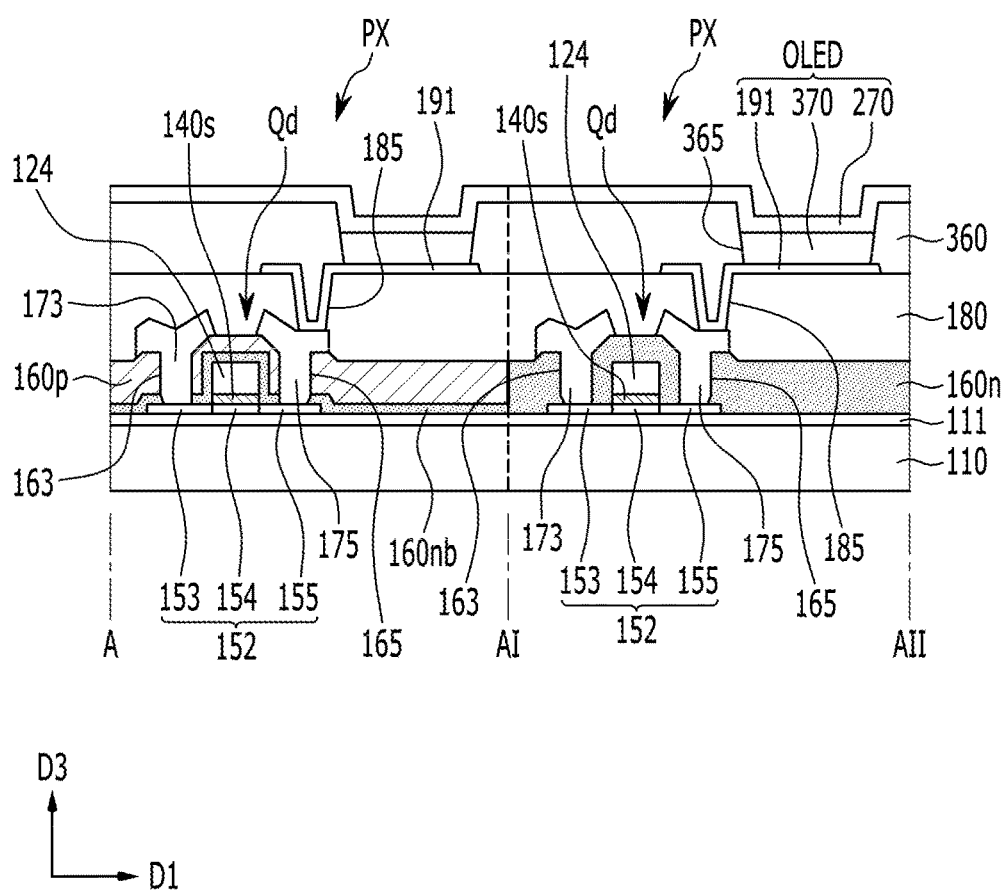
Figure 17:
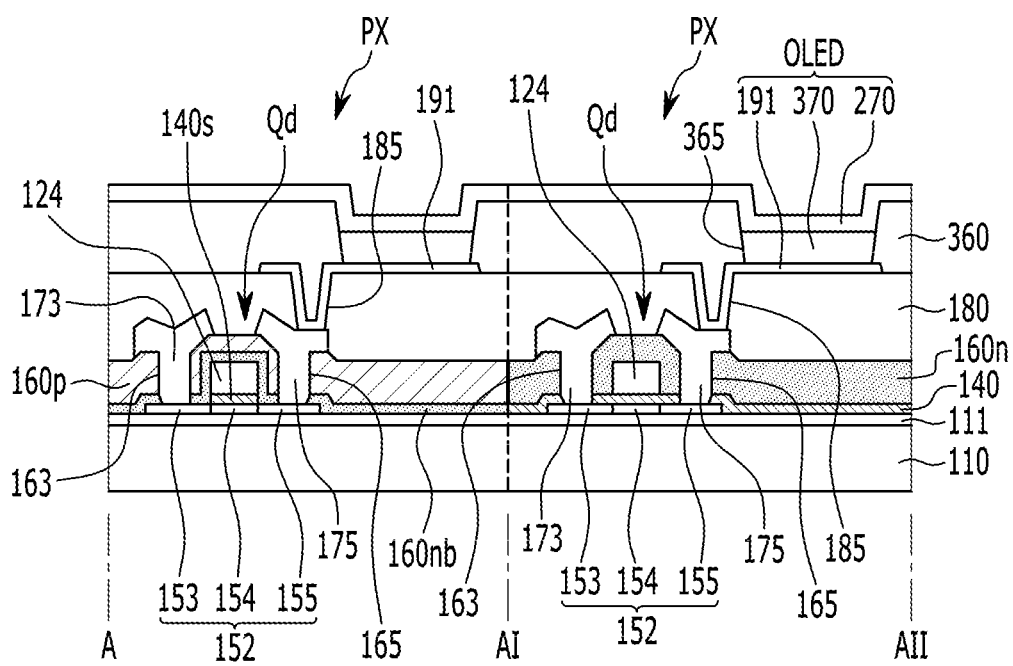

The display devices of FIG. 15 to FIG. 17 according to the present example embodiments may be mostly similar to the above-described example embodiments shown in FIG. 9 to FIG. 11, except that an insulating layer 160nb in the flexible region FA between the interlayer insulating layer 160p and the transistor Qd may be further included. The insulating layer 160nb may include the inorganic insulating material.

Accordingly, in the flexible region FA, as in the low flexibility regions PA and PB, the insulating layer 160nb made of the inorganic insulating material may be directly on the transistor Qd. Accordingly, in the manufacturing process of the display device, since the inorganic insulating material layer is deposited directly after forming the transistor Qd at (e.g., on) all of the flexible region FA and the low flexibility regions PA and PB, the amount of the impurity that is doped or diffused into the semiconductor layer 152 after depositing the inorganic insulating material layer may be substantially similar across all of the flexible region FA and the low flexibility regions PA and PB. Also, since it is easy to perform the annealing after depositing the insulating layer 160nb and the interlayer insulating layer 160n in all of the flexible region FA and the low flexibility regions PA and PB, the characteristics of the transistors Qd of the flexible region FA and the low flexibility regions PA and PB may be equally improved (e.g., be substantially equal) after the annealing. Accordingly, the difference between the characteristics of the transistor Qd in the flexible region FA and the characteristics of the transistor Qd in the low flexibility regions PA and PB may be reduced, and the reliability of the transistors Qd may be increased.

The cross-sectional thickness of the insulating layer 160nb of the flexible region FA may be smaller than the cross-sectional thickness of the interlayer insulating layer 160n of the low flexibility regions PA and PB. The insulating layer 160nb of the flexible region FA and the interlayer insulating layer 160n of the low flexibility regions PA and PB may be formed using a single photomask in one process. For example, after coating the inorganic insulating material layer on the substrate 110, by positioning a photomask (in which the transmittances corresponding to the flexible region FA and the low flexible regions PA and PB are different from each other) on the inorganic insulating material layer and performing the exposure, the insulating layer 160nb of the flexible region FA and the interlayer insulating layer 160n of the low flexibility regions PA and PB may be formed.

The planar structure of the display device according to an example embodiment of the present disclosure will be described in more detail with reference to FIG. 18 to FIG. 23 along with the above-described drawings.

FIG. 18 to FIG. 23 are each a top plan view of a display device according to an example embodiment of the present disclosure.

Figure 18:
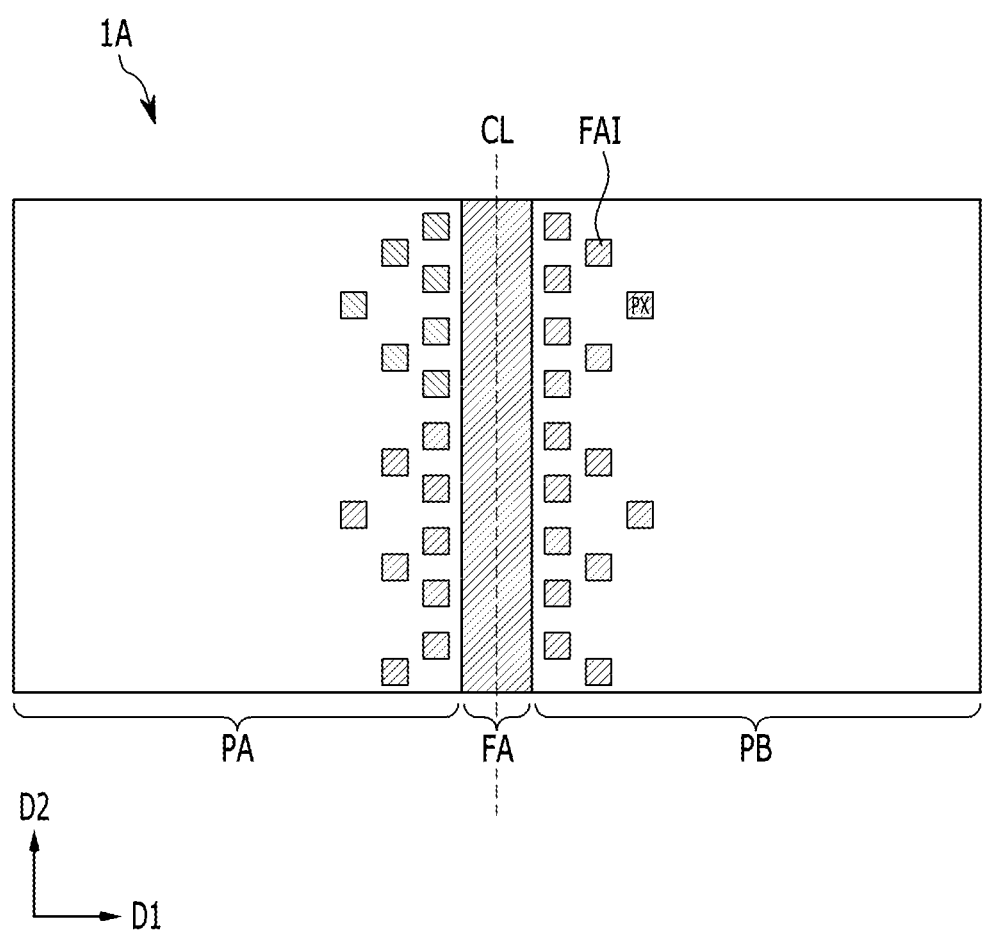
FIG. 18 to FIG. 24 are top plan views of a display device according to example embodiments of the present disclosure.

Firstly, referring to FIG. 18, the display panel 1A included in the display device according to the present example embodiment may be mostly similar to the display panel 1 according to the above-described example embodiment, except that the structures near the boundary between the flexible region FA and the low flexibility regions PA and PB may be different. For example, the low flexibility regions PA and PB may include a plurality of organic island-shaped regions FAI positioned near the flexible region FA.

The plurality of organic island-shaped regions FAI may be in the low flexibility regions PA and PB; however, the cross-sectional structure of each organic island-shaped region FAI may be substantially the same as the cross-sectional structure of the flexible region FA. For example, the cross-sectional structure of the organic island-shaped region FAI may be substantially the same as that of the left pixel PX including the interlayer insulating layer 160p for the flexible region FA shown in FIG. 3 to FIG. 5 and FIG. 9 to FIG. 17.

Each organic island-shaped region FAI may correspond to at least one pixel PX. FIG. 18 shows an example in which one organic island-shaped region FAI is a region corresponding to one pixel PX.

The plurality of organic island-shaped regions FAI, as shown in FIG. 18, may be separated from each other, or may contact each other in at least certain parts. The plurality of organic island-shaped regions FAI, as shown in FIG. 18, may be regularly arranged or may be irregularly arranged.

The organic island-shaped region FAI closest to the flexible region FA, as shown in FIG. 18, may be separated from the edge boundary of the flexible region FA, or may be connected with the flexible region FA.

The planar distribution density of the plurality of organic island-shaped regions FAI, as shown in FIG. 18, may gradually become more sparse (e.g., lower) farther away from the flexible region FA and the distribution density may become lower. As used herein, the term "planar distribution" may refer to the spatial distribution in the plane of the display.

As described above, because of differences between the characteristics of the transistor Qd in the flexible region FA including the interlayer insulating layer 160p and the transistor Qd in the low flexibility regions PA and PB including the interlayer insulating layer 160n, variations in image luminance may be generated at the boundary between the flexible region FA and the low flexibility regions PA and PB. However, in the present example embodiment, when the distribution density of the plurality of organic island-shaped regions FAI is gradually changed at the boundary between the flexible region FA and the low flexibility regions PA and PB, the visibility of the variations in image luminance due to the material difference of the interlayer insulating layers 160n and 160p positioned on the transistor Qd may be prevented or reduced.

Figure 19:
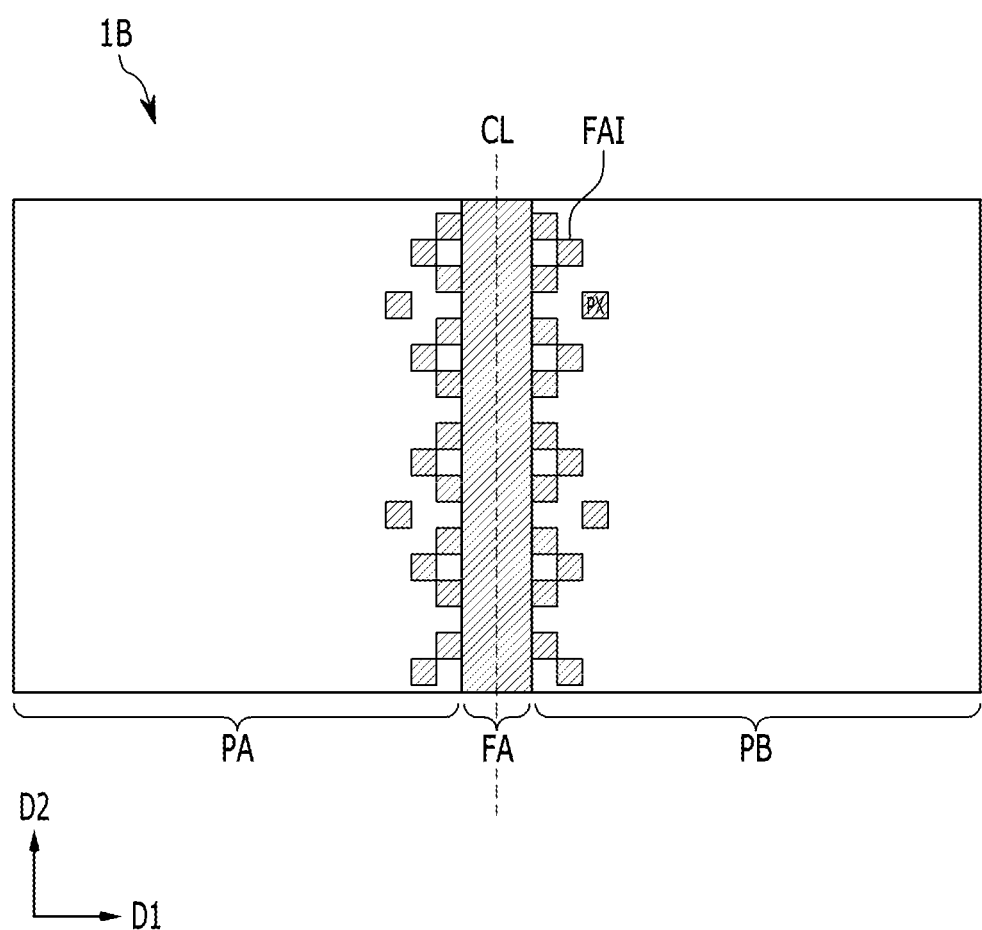

Next, referring to FIG. 19, the display panel 1B included in the display device according to the present example embodiment is mostly similar to that of the display panel 1A shown in FIG. 18 according to the above-described example embodiment; however, the planar distribution of the plurality of organic island-shaped regions FAI may be different. The organic island-shaped regions FAI closest to the flexible region FA may be connected with (e.g., substantially adjacent to) the flexible region FA. The plurality of organic island-shaped regions FAI may be arranged to form one or more columns in the second direction D2 (e.g., substantially parallel to the sides of the flexible region FA), and the adjacent edges of two adjacent columns of the organic island-shaped regions FAI may substantially accord with each other (e.g., may be substantially adjacent) or may be separated from each other.

In the example embodiments shown in FIG. 18 and FIG. 19, the arrangement of the plurality of organic island-shaped regions FAI on both sides of the flexible region FA may be symmetrical to each other with reference to a virtual center line CL.

Figure 20:
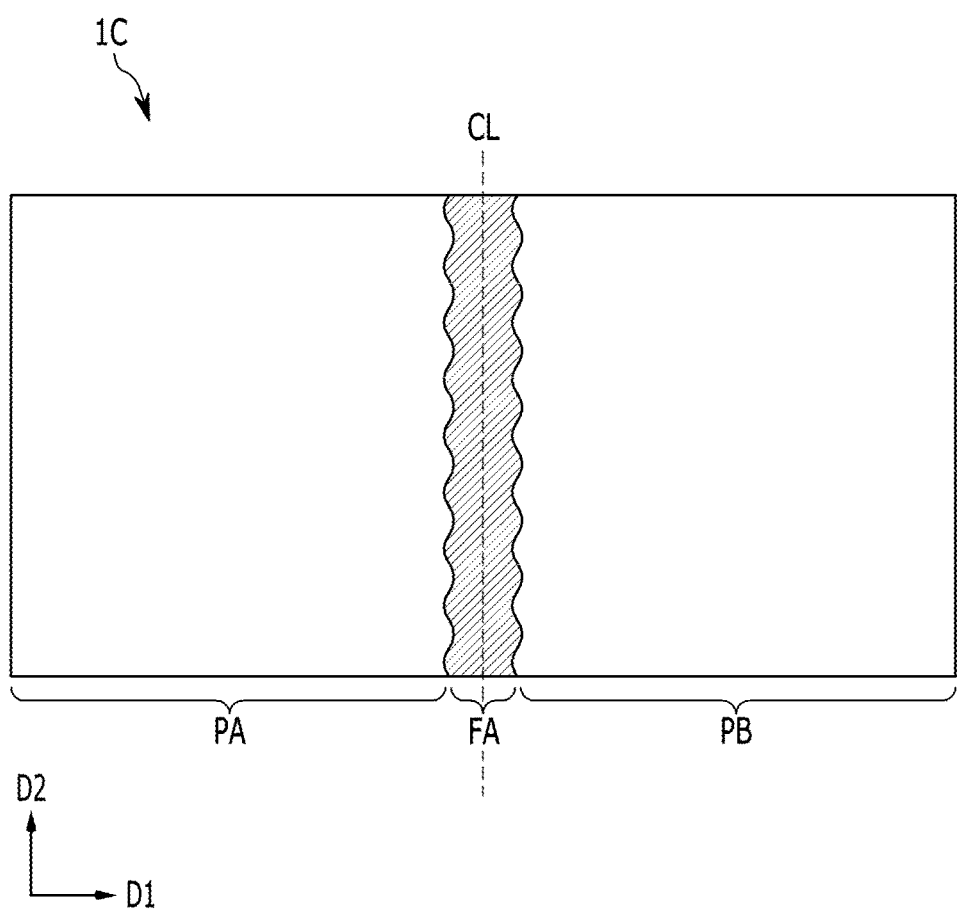

Next, referring to FIG. 20, the display panel 1C included in the display device according to the present example embodiment may be mostly similar to the display panel 1 according to the above-described example embodiment (e.g., in FIG. 1); however, the boundary between the flexible region FA and the low flexibility regions PA and PB may form a serpentine curved line rather than the straight line (with respect to the planar structure).

Figure 21:
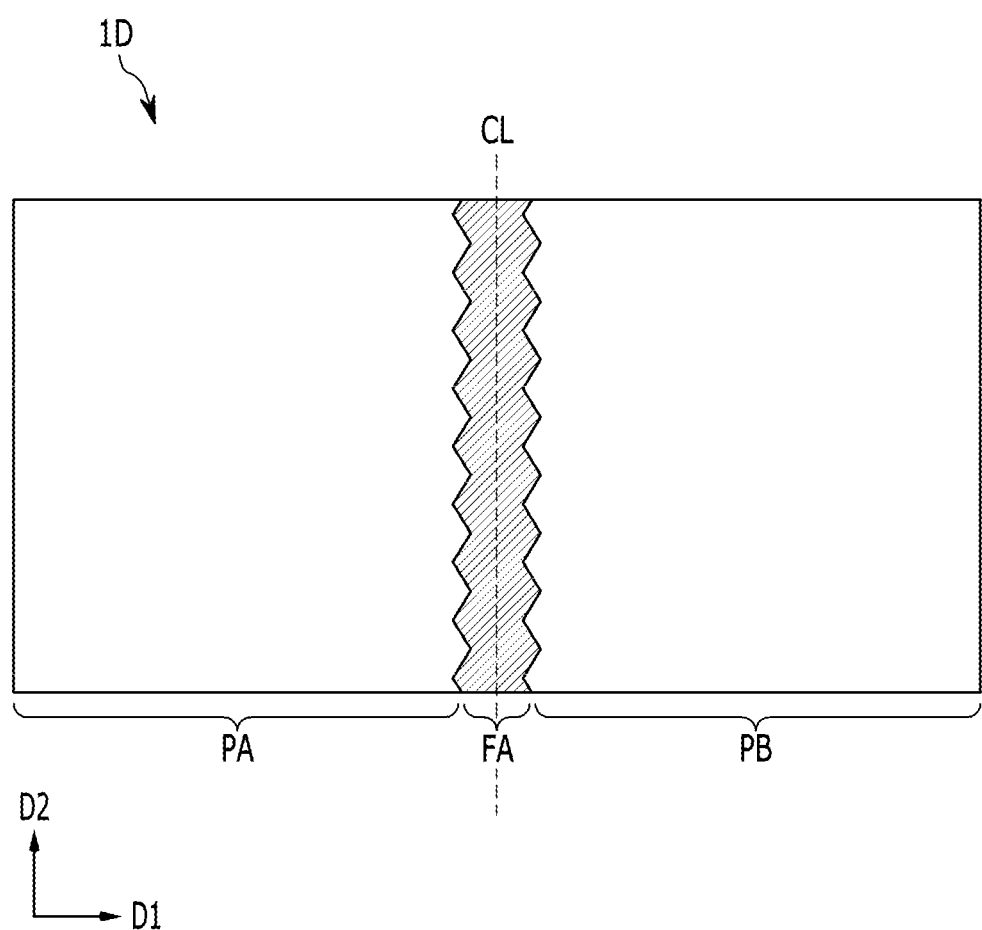

Next, referring to FIG. 21, the display panel 1D included in the display device according to the present example embodiment may be mostly similar to the display panel 1C according to the example embodiment shown in FIG. 20; however, the boundary between the flexible region FA and the low flexibility regions PA and PB may form a planar zigzag (e.g., triangle wave) line. The boundary between the flexible region FA and the low flexibility regions PA and PB may extend in oblique directions with respect to the first direction D1 and the second direction D2.

Figure 22:
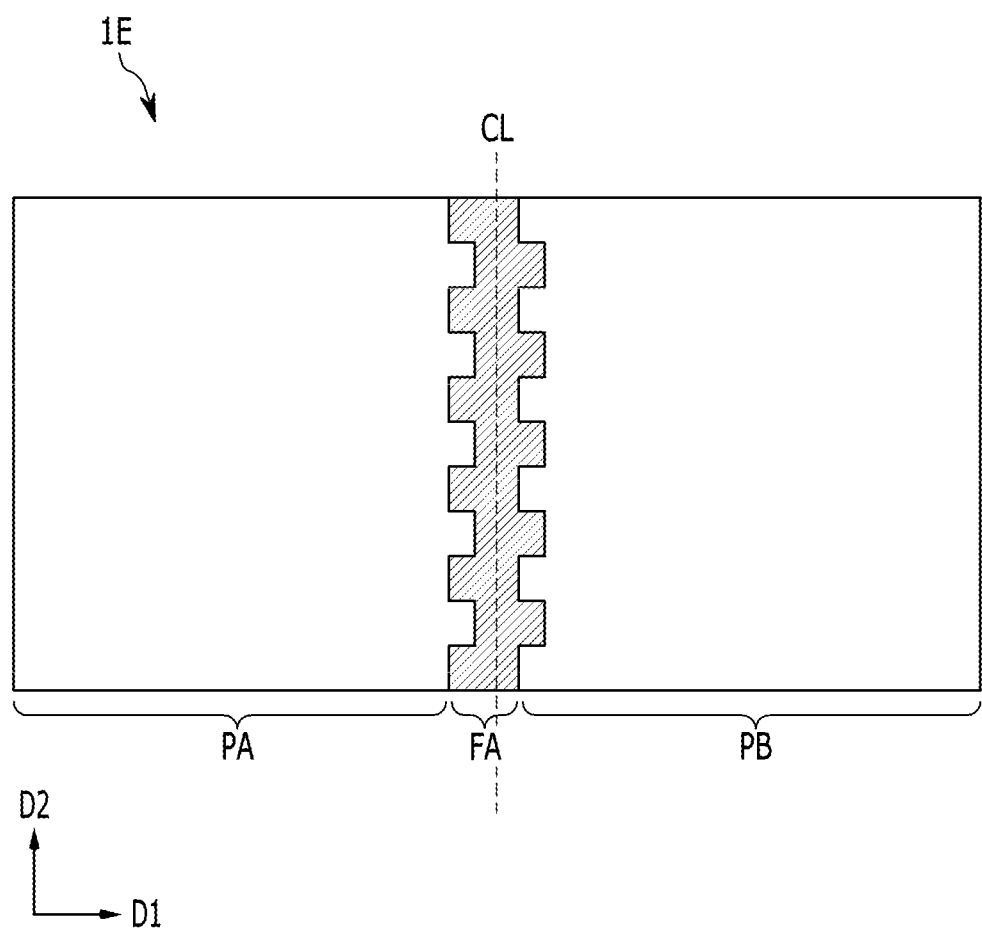
Figure 23:
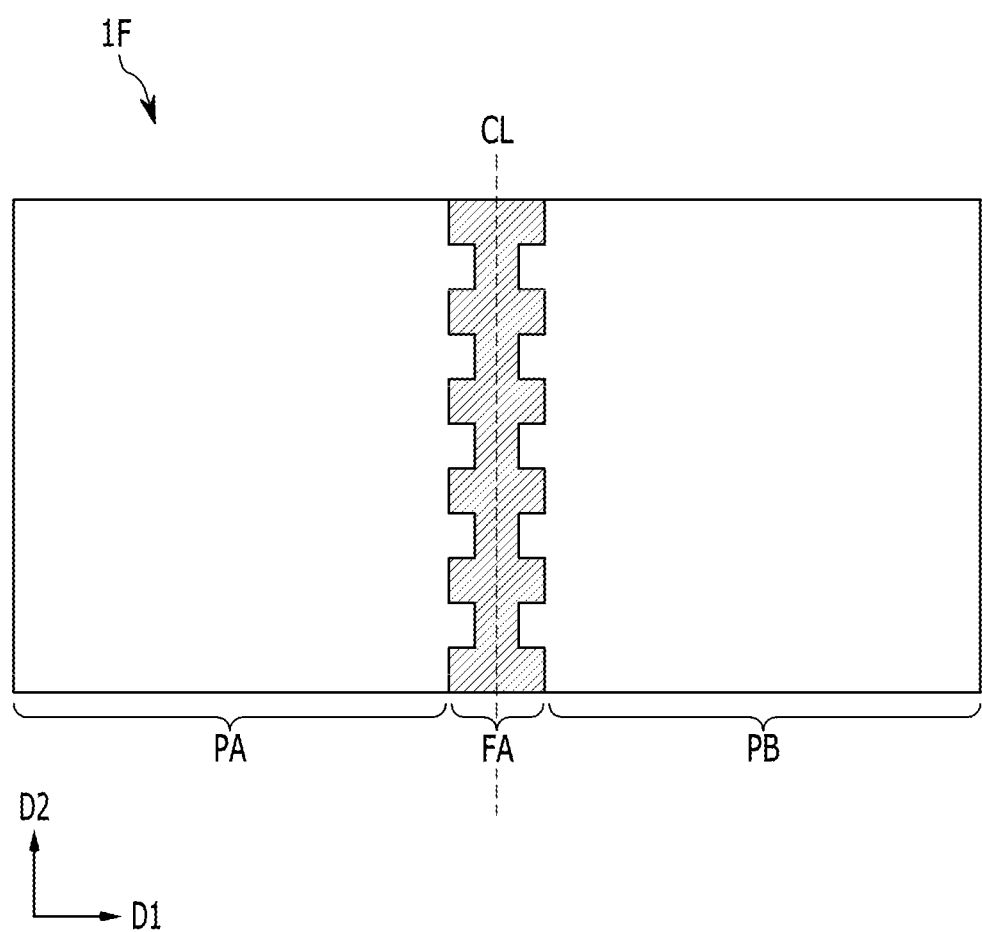

Next, referring to FIG. 22 or FIG. 23, the display panel 1E or 1F included in the display device according to the present example embodiment may be mostly similar to the display panel 1D according to the example embodiment shown in FIG. 21; however, the boundary between the flexible region FA and the low flexibility regions PA and PB may include planar protrusions and depressions. For example, the boundary line between the flexible region FA and the low flexibility regions PA and PB may include alternately positioned portions substantially parallel to the first direction D1 and substantially parallel to the second direction D2. The opposite edge boundaries of the flexible region FA (e.g., the boundaries substantially parallel to D2) may have substantially the same shape or trace (as shown in FIG. 22), or may be substantially symmetrical to each other with reference to the virtual center line CL (as shown in FIG. 23).

In the example embodiments shown in FIG. 20 to FIG. 23, the spatial period or range within which the shape of the boundary between the flexible region FA and the low flexibility regions PA and PB is changed or varied along the second direction D2 may be approximately or substantially the same as the length along the second direction D2 of at least one pixel PX, but embodiments of the present disclosure are not limited thereto.

According to the example embodiments shown in FIG. 20 to FIG. 23, compared with the case in which the boundary between the flexible region FA and the low flexibility regions PA and PB is a straight line, the visibility of variations in image luminance near the boundary between the flexible region FA and the low flexibility regions PA and PB may be reduced.

Next, the display device according to an example embodiment of the present disclosure will be described with reference to FIG. 24 to FIG. 28.

Figure 24:
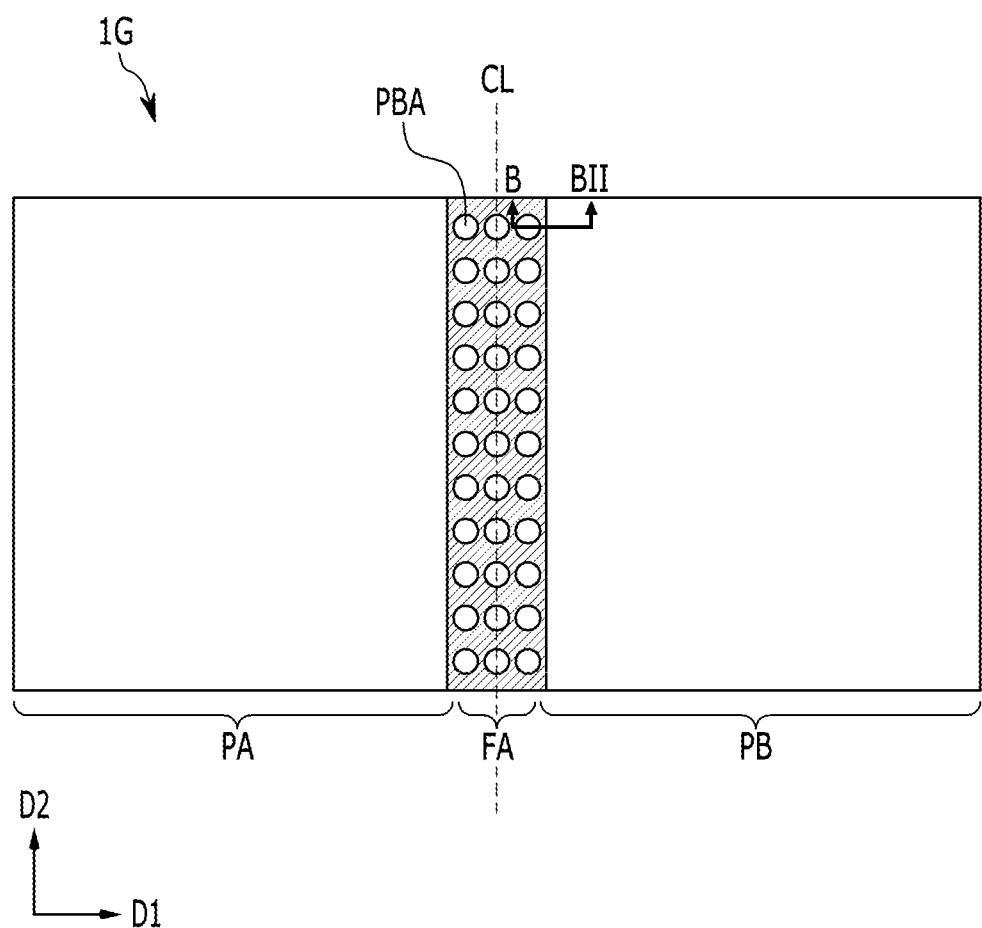
Figure 25:
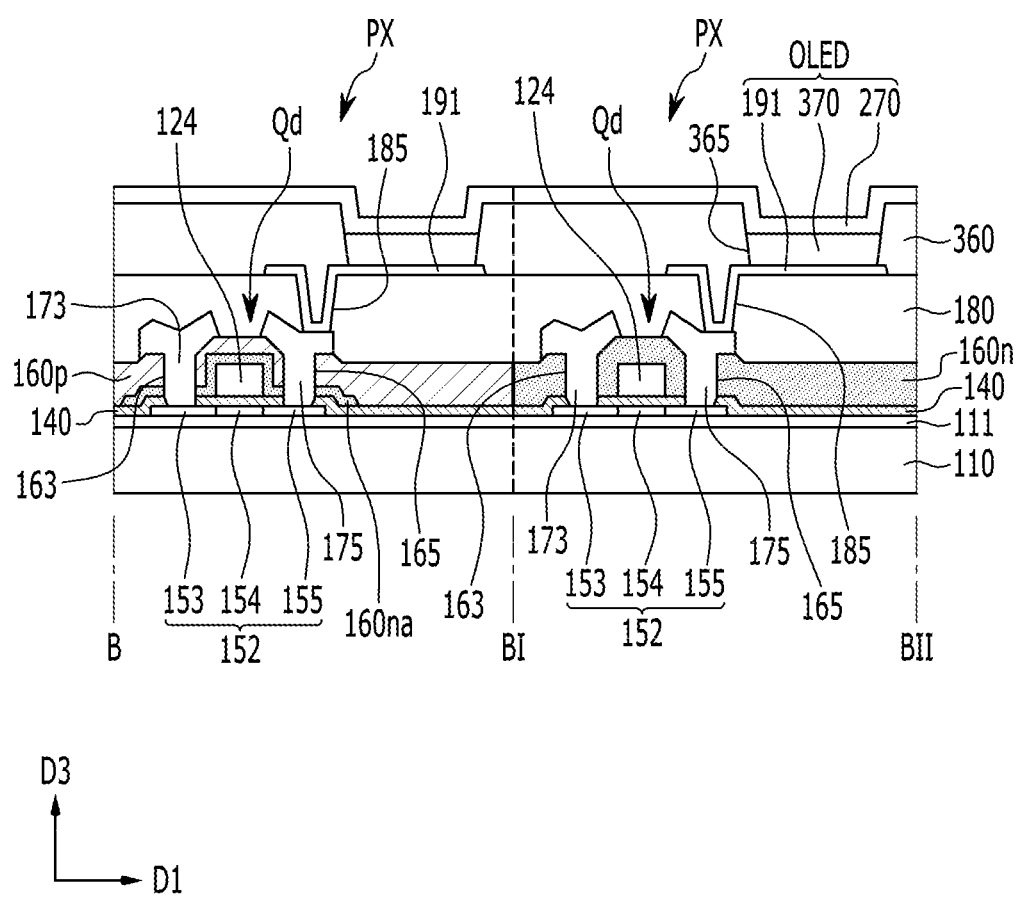
FIG. 25 to FIG. 27 are cross-sectional views of the display device shown in FIG. 24 as taken along line B-BII, according to example embodiments of the present disclosure.
Figure 26:
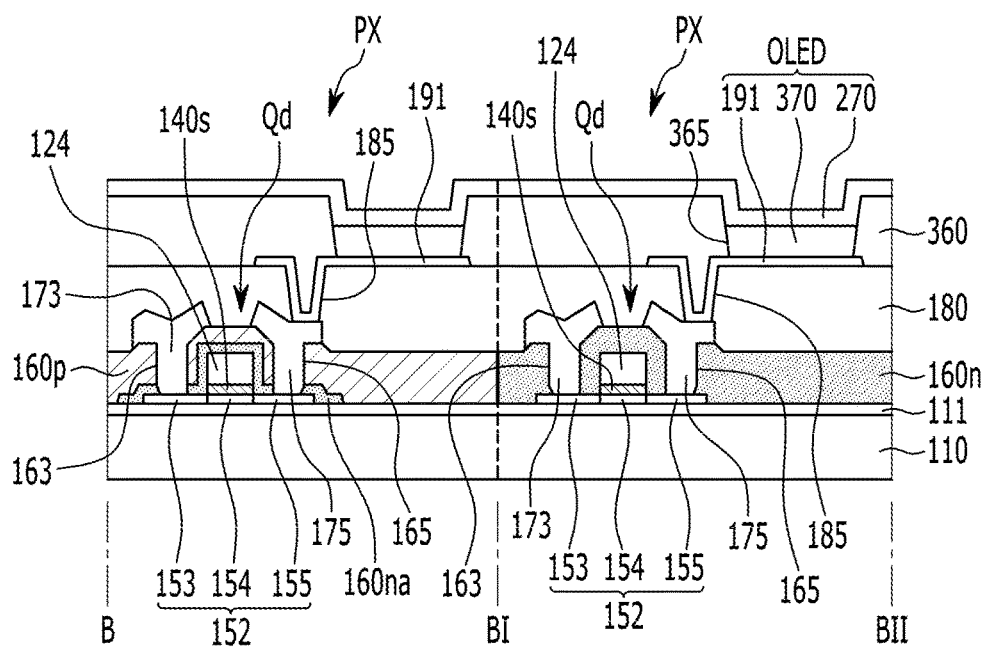
Figure 26:
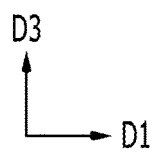
Figure 27:
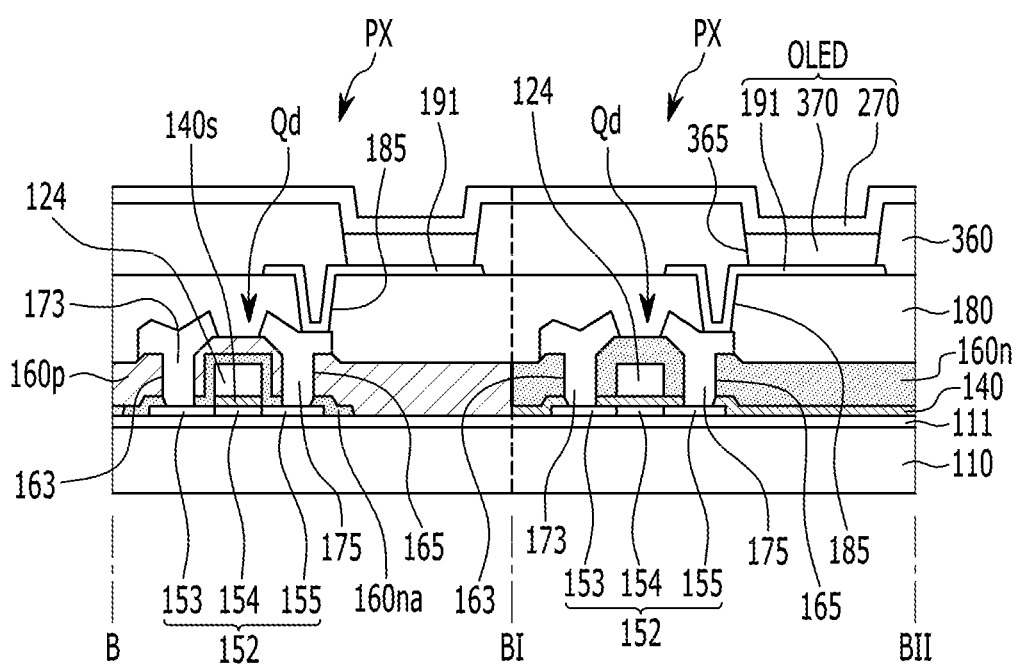
Figure 28:
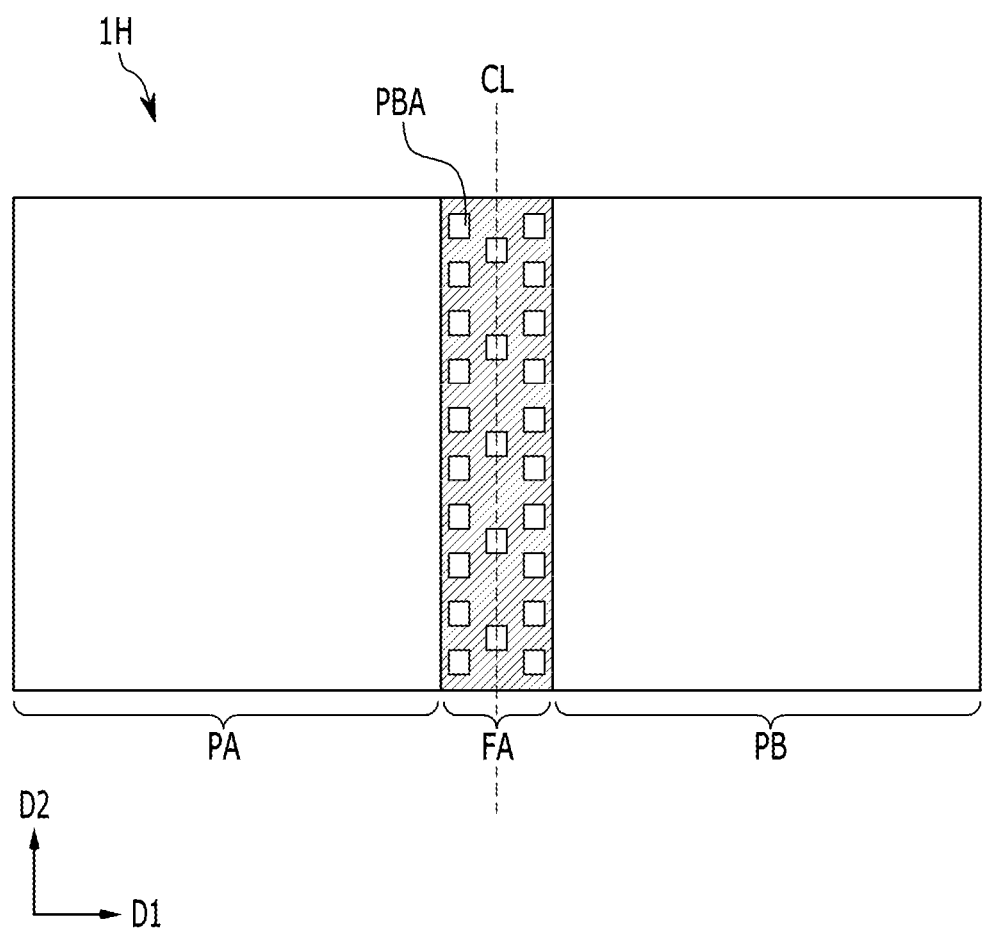
FIG. 28 to FIG. 30 are top plan views of a display device according to example embodiments of the present disclosure.

FIG. 24 is a top plan view of a display device according to an example embodiment of the present disclosure. FIG. 25 to FIG. 27 are cross-sectional views of example embodiments of the display device shown in FIG. 24 taken along a line B-BII (with midpoint BI). FIG. 28 is a top plan view of a display device according to an example embodiment of the present disclosure.

Firstly, referring to FIG. 24 to FIG. 27, the display panel 1G included in the display device according to the present example embodiment may be mostly similar to the display panel 1 according to the above-described example embodiment; however, the structure of the flexible region FA may be different. In more detail, for example, the flexible region FA may include a plurality of inorganic island-shaped regions PBA.

Referring to FIG. 25 to FIG. 27, the display panel 1G included in the display device according to the present example embodiment may be mostly similar to the above-described example embodiments shown in FIG. 15 to FIG. 17, but an additional insulating layer 160na including the inorganic insulating material may be between the interlayer insulating layer 160p and the transistor Qd in the flexible region FA, and the region formed of the insulating layer 160na may correspond to the planar inorganic island-shaped region PBA.

The insulating layer 160na is not formed on the entire surface of the flexible region FA, but includes a plurality of island-shaped regions formed only on the regions where the transistor Qd is formed. For example, each region formed with the island-shapes insulating layer 160na may be substantially the same as the region of the inorganic island-shaped region PBA. Accordingly, the interlayer insulating layer 160p may include a portion that directly contacts the buffer layer 111 or the gate insulating layer 140.

In this way, by positioning the insulating layer 160na including the inorganic insulating material directly on the transistor Qd in the flexible region FA such that the transistor Qd is not adjacent to the interlayer insulating layer 160p of the organic material insulating layer, the characteristics of the transistor Qd in the flexible region FA may be improved to substantially the same level as the transistor Qd in the low flexibility regions PA and PB. Accordingly, the differences between the characteristics of the transistor Qd in the flexible region FA and the characteristics of the transistor Qd in the low flexibility regions PA and PB may be reduced and the reliability of the transistor Qd may be increased. In addition, because most of the flexible region FA (except for the region including the transistor Qd) includes the interlayer insulating layer 160p made of only the organic insulating material between the buffer layer 111 or the gate insulating layer (140 and 140s) and the passivation layer 180, generation of defects (such as cracks) may be prevented or reduced even while the curvature radius when bending the flexible region FA is reduced.

The shape of the inorganic island-shaped region PBA may be circular as shown, but embodiments of the present disclosure are not limited thereto.

Next, referring to FIG. 28, a display panel 1H included in the display device according to the present example embodiment may be mostly similar to the display panel 1G according to the above-described example embodiment shown in FIG. 24; however, the arrangement of the inorganic island-shaped regions PBA may be different. In more detail, for example, the arrangement density of the inorganic island-shaped regions PBA may be lower with increasing distance from the low flexibility regions PA and PB, and conversely may be higher with increasing proximity thereto. According to the present example embodiment, the insulating layer 160na may be included in one portion of the transistor Qd in the flexible region FA, and the insulating layer 160na may not be included in the other portion.

The shape of the inorganic island-shaped region PBA may be a quadrangle (e.g., square or rectangle) as shown, but embodiments of the present disclosure are not limited thereto.

The display device according to an example embodiment of the present disclosure will be described in more detail with reference to FIG. 29 and FIG. 30.

Figure 29:
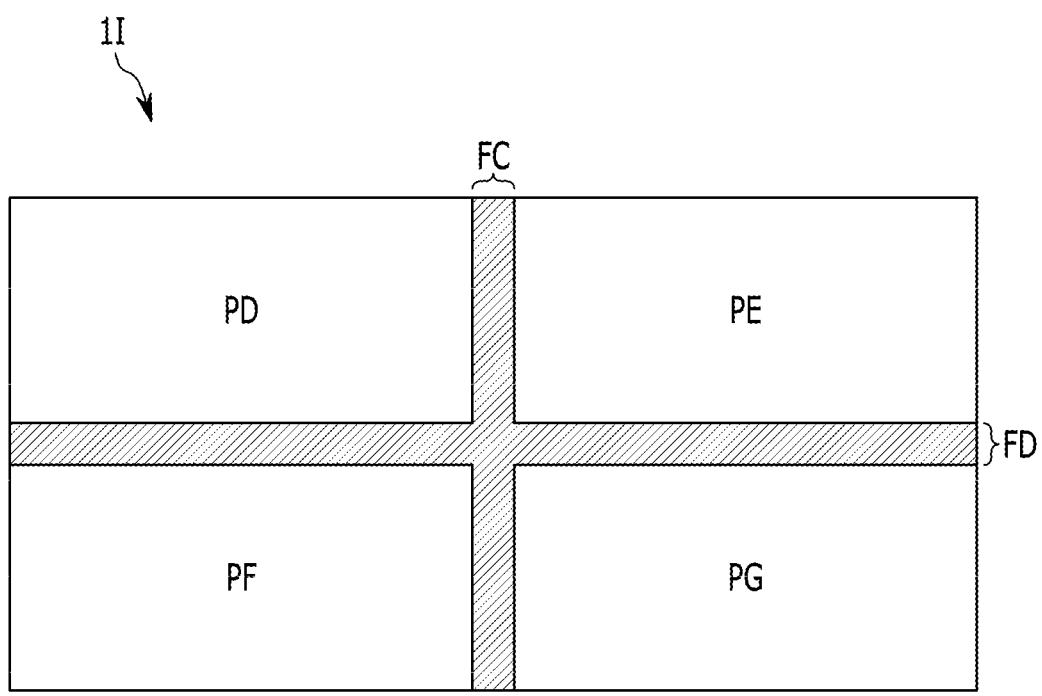
Figure 30:
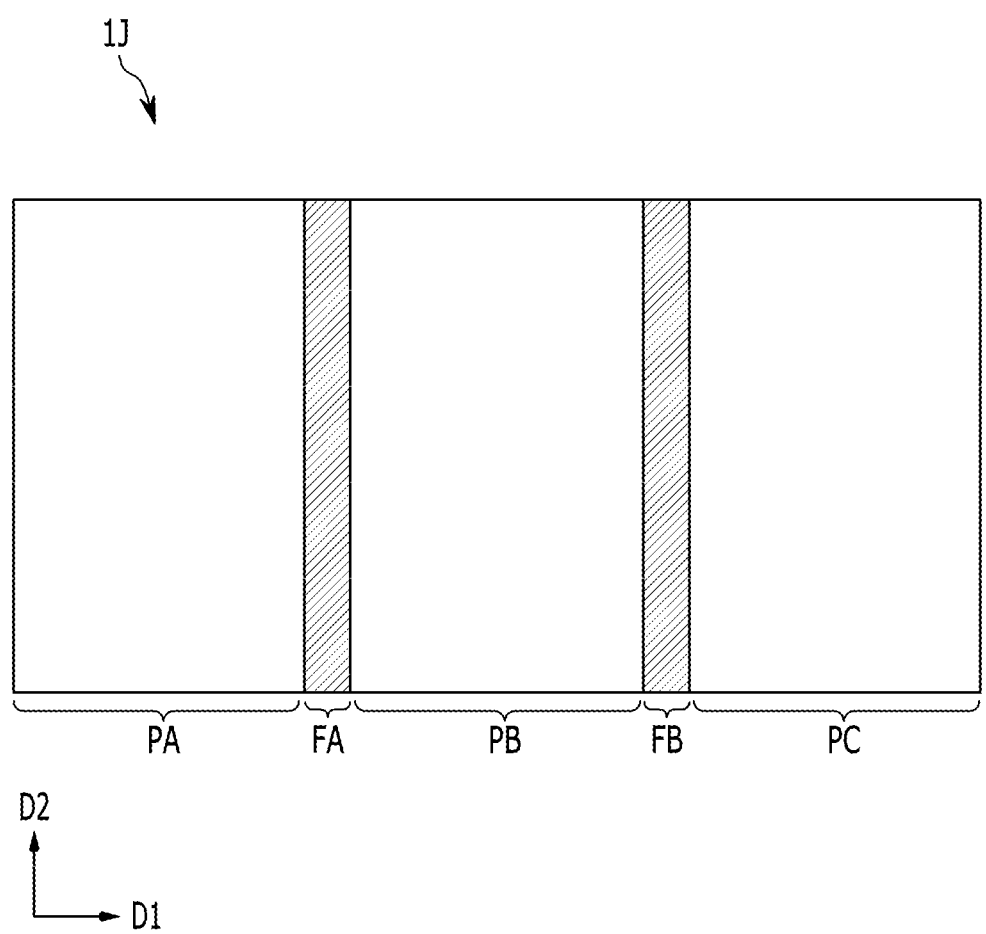

FIG. 29 and FIG. 30 are each a top plan view of a display device according to an example embodiment of the present disclosure.

Firstly, referring to FIG. 29, the display panel 1I included in the display device according to an example embodiment of the present disclosure may be mostly similar to the display panel 1 according to the above-described example embodiment shown in FIG. 1; however, a plurality of flexible regions FC and FD and a plurality of low flexibility regions PD, PE, PF, and PG extending in different directions may be included.

FIG. 29 shows an example in which the display panel 1I includes two flexible regions FC and FD extending in substantially different (e.g., substantially perpendicular) directions. One flexible region FC extends in the direction approximately or substantially parallel to the second direction D2, and the other flexible region FD extends in the direction approximately or substantially parallel to the first direction D1, but embodiments of the present disclosure are not limited thereto. The two flexible regions FC and FD may cross each other. The display panel 1I may be respectively bent in the flexible regions FC and FD, thereby being entirely folded two or more times.

The cross-sectional structures of the flexible regions FC and FD of the display panel 1I according to the present example embodiment may each be the same as the cross-sectional structures of the flexible region FA according to the above-described several example embodiments, and the cross-sectional structures of the low flexibility regions PD, PE, PF, and PG may each be substantially the same as the cross-sectional structures of the low flexibility regions PA and PB of the above-described several example embodiments.

Next, referring to FIG. 30, the display panel 1J included in the display device according to an example embodiment of the present disclosure may be mostly similar to the display panel 1 according to the above-described example embodiment shown in FIG. 1; however, a plurality of flexible regions FA and FB may be included. The plurality of flexible regions FA and FB may extend to be substantially parallel to each other as shown, but embodiments of the present disclosure are not limited thereto. The low flexibility regions PA, PB, and PC may be positioned between the adjacent flexible regions FA and FB.

Now, the display device according to an example embodiment of the present disclosure will be described with reference to FIG. 31 to FIG. 34.

Figure 31:
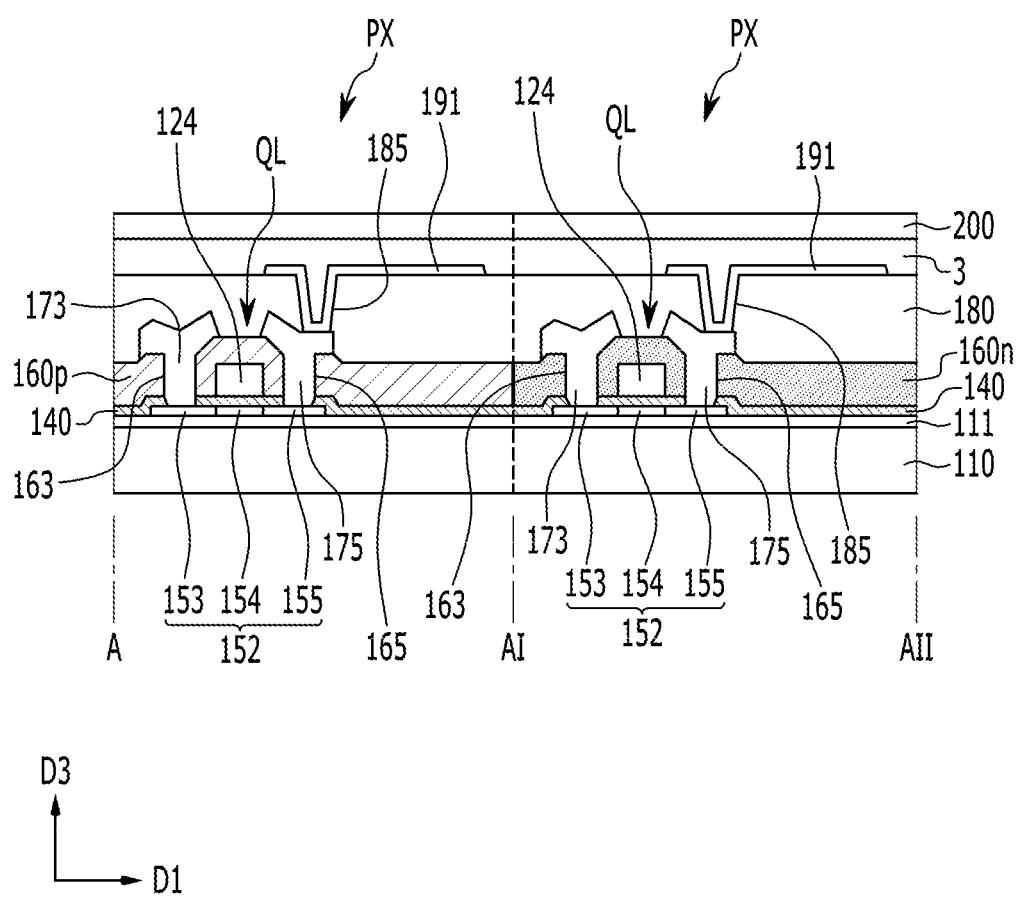
FIG. 31 to FIG. 33 are cross-sectional views of the display device shown in FIG. 1 as taken along line A-AII, according to example embodiments of the present disclosure.
Figure 32:
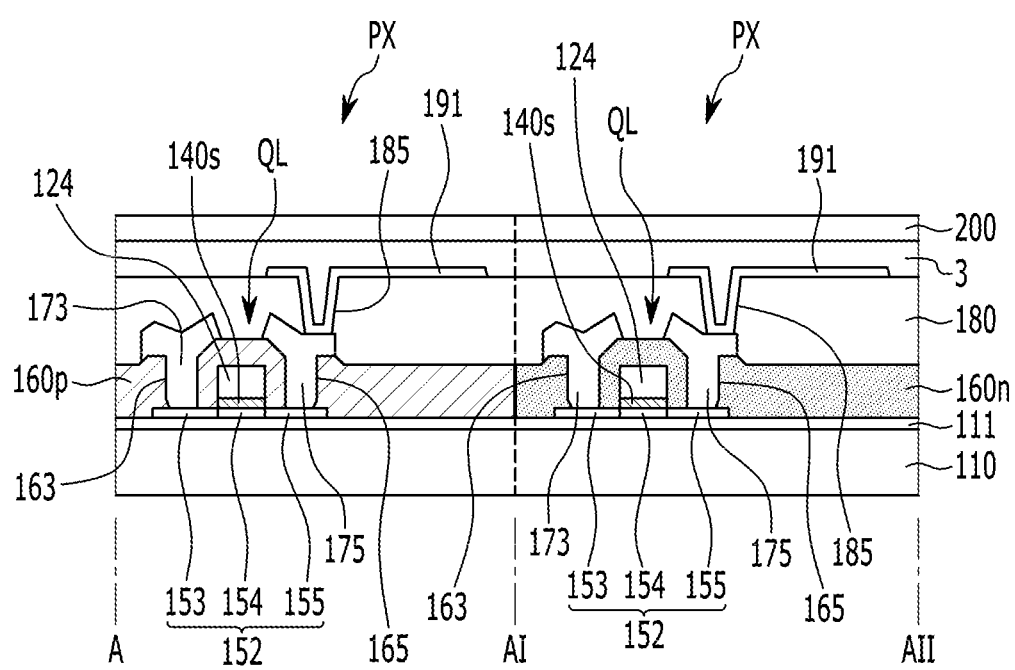
Figure 32:
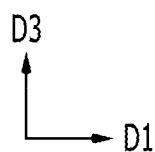
Figure 33:
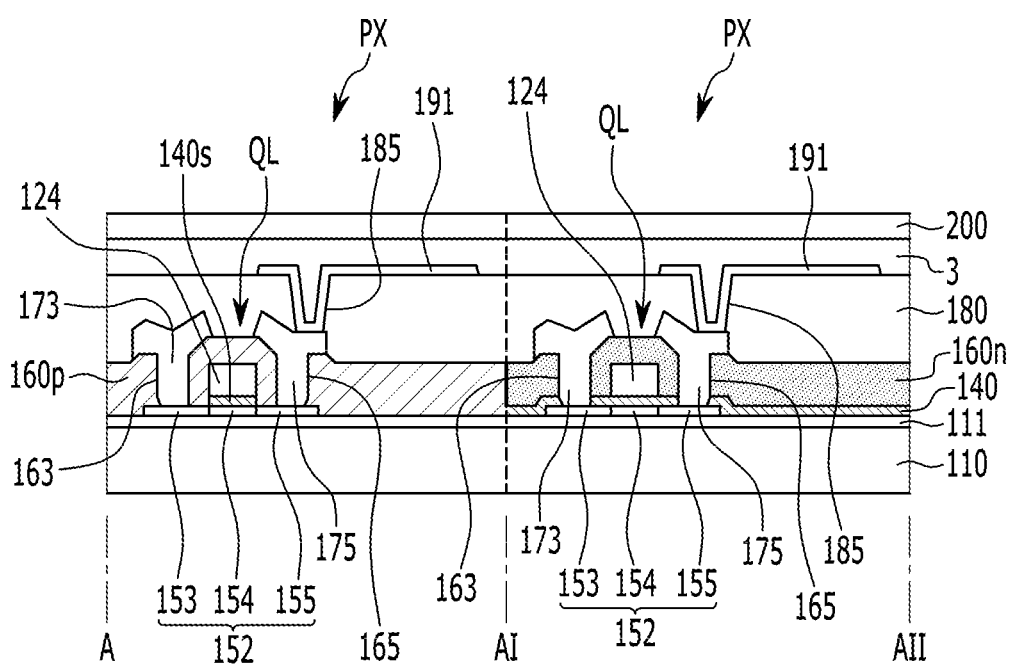
Figure 33:
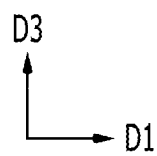
Figure 34:
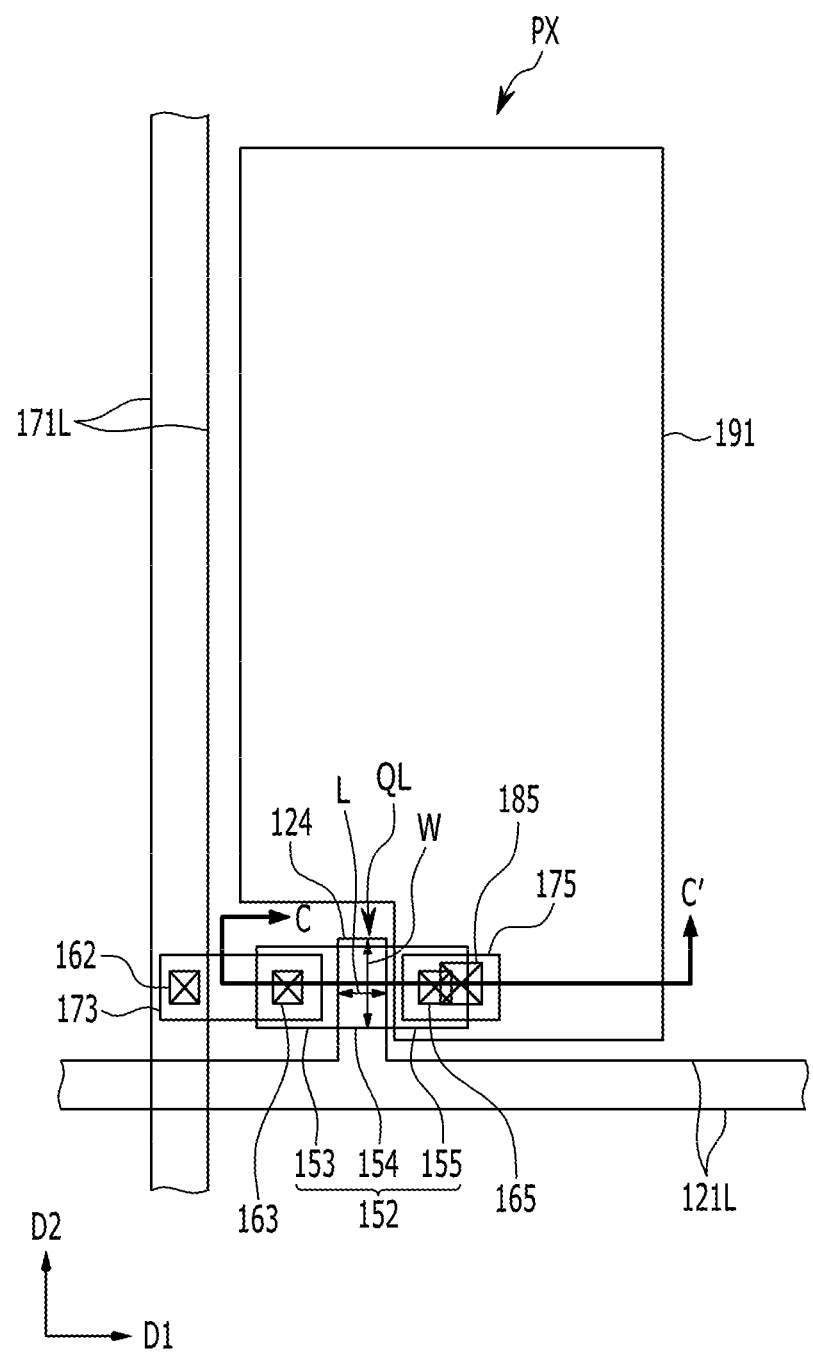
FIG. 34 is a layout view of one pixel of a display device according to an example embodiment of the present disclosure.

FIG. 31 to FIG. 33 are cross-sectional views of the display device shown in FIG. 1 taken along line A-AII, respectively, and FIG. 34 is a layout view of one pixel of a display device according to an example embodiment of the present disclosure.

Referring to FIG. 31 to FIG. 33, the display device according to the present example embodiment may be a liquid crystal display, and may have a structure mostly similar to those of the above-described example embodiments shown in FIG. 3 to FIG. 5. However, the layered structure on the pixel electrode 191 may be different.

According to the present example embodiment, a liquid crystal layer 3 including a plurality of liquid crystal molecules may be on the pixel electrode 191, and an upper layer 200 facing the pixel electrode 191 may be on the liquid crystal layer 3. The upper layer 200 may include a separate substrate or an insulating layer that is different from the substrate 110. Also, the upper layer 200 may include a common electrode generating an electric field to the liquid crystal layer 3 along with the pixel electrode 191. Alternatively, the common electrode may be between the liquid crystal layer 3 and the transistor Qd.

The cross-sectional view corresponding to each pixel PX of FIG. 31 to FIG. 33 corresponds to the cross-sectional view taken along the line C-C' shown in FIG. 34, and the line A-AI-AII shown in FIG. 31 to FIG. 33 corresponds to the line A-II shown in FIG. 1.

Referring to FIG. 34 along with FIG. 31 to FIG. 33, signal lines (such as a gate line 121L transmitting the gate signal and/or a data line 171L transmitting the data signal) may also be on the substrate 110.

The semiconductor layer 152 including the channel region 154, the source region 153, and the drain region 155 forms the transistor QL along with the gate electrode 124. The gate signal may be applied to the gate electrode 124 via the gate line 121L. The gate line 121L may be in the same layer as the gate electrode 124 or may be in a different layer.

The data signal may be applied to the source electrode 173 connected with the source region 153 of the transistor QL via the data line 171L. The data line 171L may be in the same layer as the source electrode 173 or may be in a different layer. When the data line 171L is in a different layer from the source electrode 173, the interlayer insulating layers 160n and 160p may include a contact hole 162 overlapping the data line 171L.

In the liquid crystal display according to the present example embodiment, the transistor QL may be turned on/off depending on the gate signal from the gate line 121L, and the voltage data signal from the data line 171L may be transmitted to the pixel electrode 191 when the transistor QL is in the 'on' state. The data signal voltage applied to the pixel electrode 191 generates an electric field in the liquid crystal layer 3 such that the arrangement of the liquid crystal molecules of the liquid crystal layer 3 may be suitably controlled, thereby controlling the optical characteristics of the light passing through the liquid crystal layer 3.

The value (e.g., ratio) of the channel width W/the channel length L of the transistor QL in the flexible region FA may be different from the value (e.g., ratio) of the channel width W/the channel length L of the transistor QL in the low flexibility regions PA and PB. Accordingly, the characteristics of the transistor QL in the flexible region FA and the characteristics of the transistor QL in the low flexibility regions PA and PB may be suitably controlled or selected to be identical or substantially identical to each other. Also, variations in image luminance near the boundary between the flexible region FA and the low flexibility regions PA and PB may be prevented from being recognized (e.g., reduced) by controlling the data signal applied to the pixel PX.

Figure 35:
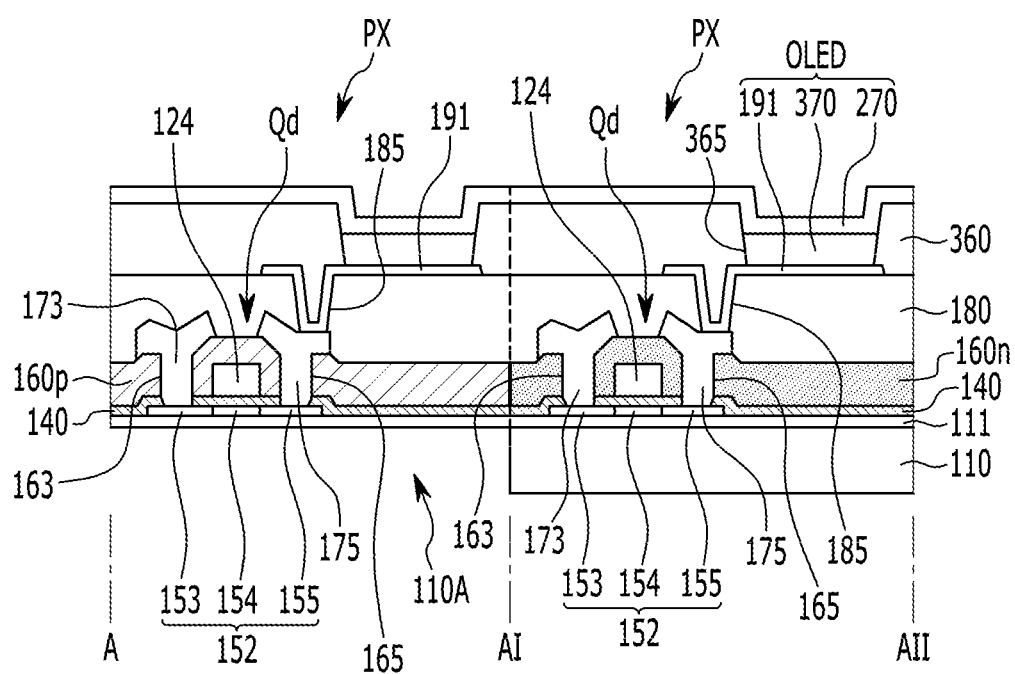
FIG. 35 is a cross-sectional view of the display device shown in FIG. 1 as taken along the line A-AII, according to an example embodiment of the present disclosure.
Figure 35:
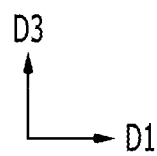

FIG. 35 is another example embodiment of a cross-sectional view of the display device shown in FIG. 1 as taken along line A-AII.

Referring to FIG. 35, the substrate 110 of the display panel included in the display device according to an example embodiment of the present disclosure may include an opening 110A corresponding to the flexible region FA. For example, when the substrate 110 is non-flexible and the substrate 110 is removed in the flexible region FA, the display panel may be freely bent in the flexible region FA.

Next, an example in which the display device according to an example embodiment of the present disclosure is used in a vehicle will be described with reference to FIG. 35 and FIG. 36.

Figure 36:
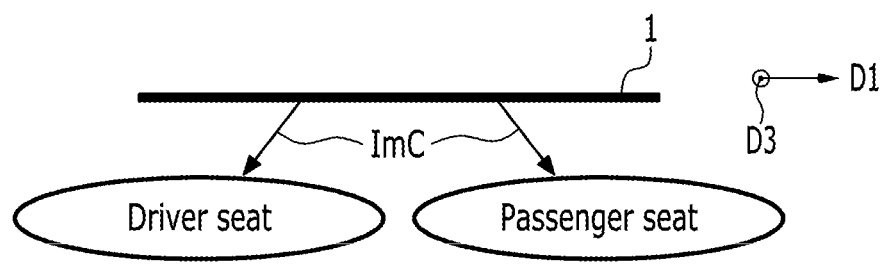
FIG. 36 is a schematic view showing an example of a display device used inside of a vehicle, according to an example embodiment of the present disclosure.
Figure 37:
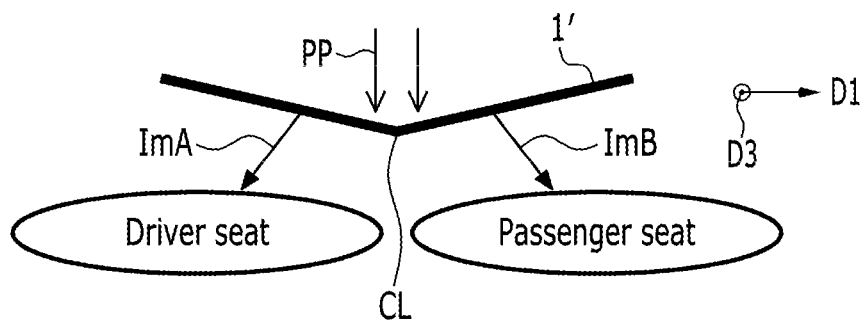
FIG. 37 is a schematic view showing an example of a display device used inside of a vehicle where a portion of the display device shown in FIG. 36 is bent, according to an example embodiment of the present disclosure.

FIG. 36 is a schematic view showing an example in which a display device according to an example embodiment of the present disclosure is used inside of a vehicle, and FIG. 37 is a schematic view showing an example in which a portion of the display device shown in FIG. 36 is bent.

Referring to FIG. 35, the display panel 1 of the display device according to an example embodiment of the present disclosure may be substantially the same as the display panel according to the example embodiments shown in FIG. 18 to FIG. 34 as well as the above-described example embodiments shown in FIG. 1 to FIG. 17.

The display panel 1 may be installed at a place that may be seen from both a driver's seat and a passenger seat of the vehicle (e.g., on top of a dashboard and/or in front of a center fascia, dashboard, or console). When the display panel 1 is unfolded in the state of being substantially parallel to the first direction D1, as shown in FIG. 36, users seated in the driver's seat and the passenger seat may observe the same image ImC. This may be the case when the user in the driver's seat is not driving. Accordingly, the users seated in the driver's seat and the passenger seat may enjoy the image of the wide screen together.

Referring to FIG. 37, the display panel 1 may be bent at the virtual center line CL. In this case, the shape of the display panel 1 may be changed through a driving device PP. The screen of the changed state 1' may be divided into a plurality of portions, thereby displaying separate images. This may be the case when the user in the driver's seat is driving.

As shown in FIG. 37, the portion of the screen facing the driver's seat may display an image ImA for the driver, and the portion of the screen facing the passenger's seat may display an image ImB for the passenger. The images ImA and ImB may be different from each other. For example, the driver image ImA may be an image related to driving (such as a navigation image) and the passenger image ImB may be an image that is not related to driving.

As described above and according to embodiments of the present disclosure, when the bendable display device is applied to the vehicle, the value of the vehicle display device may be maximized or increased.

As used herein, expressions such as "at least one of", "one of", and "selected from", when preceding a list of elements, modify the entire list of elements and do not modify the individual elements of the list. Further, the use of "may" when describing embodiments of the present disclosure refers to "one or more embodiments of the present disclosure".

In addition, as used herein, the terms "use", "using", and "used" may be considered synonymous with the terms "utilize", "utilizing", and "utilized", respectively.

As used herein, the terms "substantially", "about", and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims and equivalents thereof.

| Description of some of the symbols | |
| --- | --- |
| 110: substrate | 111: buffer layer |
| 121: gate line | 124: gate electrode |
| 140, 140s: gate insulating layer | 152: semiconductor layer |
| 160n, 160p: interlayer insulating layer | 162, 163, 165: contact hole |
| 173: source electrode | 175: drain electrode |
| 180: passivation layer | 191: pixel electrode |

What is claimed is:

1. A display device comprising:
a display panel comprising a flexible region and a low flexibility region having lower flexibility than the flexible region,
the flexible region comprising a plurality of first pixels, each first pixel comprising:
a first transistor comprising a first semiconductor layer and a first gate electrode,
a first conductor connected to the first semiconductor layer, and
a first portion of an interlayer insulating layer between the first transistor and the first conductor, the first portion of the interlayer insulating layer consisting of an organic insulating material;
the low flexibility region comprising a plurality of second pixels, each second pixel comprising:
a second transistor comprising a second semiconductor layer and a second gate electrode,
a second conductor connected to the second semiconductor layer, and
a second portion of the interlayer insulating layer between the second transistor and the second conductor, the second portion of the interlayer insulating layer consisting of an inorganic insulating material;
a ratio of a channel width to a channel length of the first transistor being different from a ratio of a channel width to a channel length of the second transistor,
the display panel further comprising an insulating layer disposed on the first conductor and the second conductor, and
the first portion of the interlayer insulating layer and the second portion of the interlayer insulating layer directly contacting a lower surface of the insulating layer.

2. The display device of claim 1, wherein:
the ratio of the channel width to the channel length of the first transistor is larger than the ratio of the channel width to the channel length of the second transistor.

3. The display device of claim 1, wherein:
a side surface of the first portion of the interlayer insulating layer contacts a side surface of the second portion of the interlayer insulating layer at a boundary between the flexible region and the low flexibility region.

4. The display device of claim 1, wherein:
the first portion of the interlayer insulating layer is only between the first gate electrode and the first conductor, and the second portion of the interlayer insulating layer is only between the second gate electrode and the second conductor.

5. The display device of claim 3, wherein:
the first transistor comprises a first gate insulating layer between the first gate electrode and the first semiconductor layer, and
the second transistor comprises a second gate insulating layer between the second gate electrode and the second semiconductor layer.

6. The display device of claim 5, wherein:
the first gate insulating layer comprises the organic insulating material.

7. The display device of claim 6, wherein:
the first gate insulating layer is only between the first gate electrode and the first semiconductor layer and does not overlap another portion of the first semiconductor layer.

8. The display device of claim 3, wherein:
an interface between the first portion of the interlayer insulating layer and the second portion of the interlayer insulating layer is obliquely inclined or tilted relative to a lower surface of the display device at the boundary between the flexible region and the low flexibility region when the display device is in an unfolded state.

9. The display device of claim 3, wherein:
an interface between the first portion of the interlayer insulating layer and the second portion of the interlayer insulating layer has a stepped shape or a protrusion and depression shape along the boundary between the flexible region and the low flexibility region.

10. The display device of claim 1, wherein:
each first pixel further comprises a first inorganic insulating layer between the first interlayer insulating layer and the first transistor.

11. The display device of claim 10, wherein:
the first inorganic insulating layer comprises a plurality of island-shaped regions, and
each island-shaped region is positioned only in a region corresponding to a position of the first transistor.

12. The display device of claim 11, wherein:
a planar distribution density of the plurality of island-shaped regions of the first inorganic insulating layer is increased as proximity to the low flexibility region increases.

13. The display device of claim 1, wherein:
the low flexibility region further comprises a plurality of third pixels, each third pixel comprising:
a third transistor comprising a third semiconductor layer and a third gate electrode,
a third conductor connected to the third semiconductor layer, and
a third portion of the interlayer insulating layer between the third transistor and the third conductor,
wherein the third portion of the interlayer insulating layer comprises an organic insulating material.

14. The display device of claim 13, wherein:
a planar distribution density of the plurality of third pixels in the low flexibility region is decreased as proximity to the flexible region decreases.

15. The display device of claim 1, wherein:
a boundary between the flexible region and the low flexibility region forms a straight line, as observed in a plan view.

16. The display device of claim 1, wherein:
a boundary between the flexible region and the low flexibility region is winding, comprises protrusions and depressions, or extends in a zigzag line, as observed in a plan view.

17. The display device of claim 1, wherein:
the display device is an organic light emitting diode display comprising an organic emission layer.

18. A display device comprising:
a display panel comprising a flexible region and a low flexibility region having lower flexibility than the flexible region,
the flexible region comprising a plurality of first pixels, each first pixel comprising:
a first transistor comprising a first semiconductor layer and a first gate electrode,
a first conductor connected to the first semiconductor layer, and
a first portion of an interlayer insulating layer between the first transistor and the first conductor, the first portion of the interlayer insulating layer consisting of an organic insulating material and directly contacting the first gate electrode, the low flexibility region comprising a plurality of second pixels, each second pixel comprising:
- a second transistor comprising a second semiconductor layer and a second gate electrode,
- a second conductor connected to the second semiconductor layer, and
- a second portion of the interlayer insulating layer between the second transistor and the second conductor, the second portion of the interlayer insulating layer consisting of an inorganic insulating material and directly contacting the second gate electrode.

19. The display device of claim 1, wherein at least one of the first portion of the interlayer insulating layer and the second portion of the interlayer insulating layer is a multiple layer structure.

20. The display device of claim 13, wherein the plurality of third pixels are arranged to define one or more columns substantially parallel to sides of the flexible region.

21. The display device of claim 1, wherein:
- the low flexibility region comprises a plurality of low flexibility regions, and
- the flexible region comprises a plurality of flexible regions extending in directions substantially parallel and/or substantially perpendicular to each other, with the plurality of low flexibility regions therebetween.

22. The display device of claim 21, wherein a first of the plurality of flexible regions extends in a first direction and a second of the plurality of flexible regions extends in a second direction crossing the first direction, and the first and second of the plurality of flexible regions intersect each other.

23. The display device of claim 1, wherein the display panel is configured to provide feedback to the first transistor and the second transistor to control a data signal value provided by the first transistor and the second transistor.

24. The display device of claim 1, wherein the ratio of the channel width to the channel length of the first transistor and the ratio of the channel width to the channel length of the second transistor are configured to provide substantially equal luminance to the display panel.

25. The display device of claim 7, wherein:
- the second gate insulating layer is only between the second gate electrode and the second semiconductor layer and does not overlap another portion of the second semiconductor layer.

* * * * *